(12) United States Patent
Kim et al.

(10) Patent No.: US 12,389,600 B2
(45) Date of Patent: Aug. 12, 2025

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Jiwon Kim, Hwaseong-si (KR); Sangdon Lee, Hwaseong-si (KR); Sungmin Hwang, Hwaseong-si (KR); Sukkang Sung, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 534 days.

(21) Appl. No.: 17/701,304

(22) Filed: Mar. 22, 2022

(65) Prior Publication Data
US 2022/0399368 A1 Dec. 15, 2022

(30) Foreign Application Priority Data
Jun. 10, 2021 (KR) .......................... 10-2021-0075366

(51) Int. Cl.
| | |
|---|---|
| H10B 43/27 | (2023.01) |
| H01L 23/48 | (2006.01) |
| H10B 41/10 | (2023.01) |
| H10B 41/27 | (2023.01) |
| H10B 41/35 | (2023.01) |
| H10B 43/10 | (2023.01) |
| H10B 43/35 | (2023.01) |

(52) U.S. Cl.
CPC ........... *H10B 43/27* (2023.02); *H01L 23/481* (2013.01); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ................................ H10B 41/10; H10B 41/27
See application file for complete search history.

(56) References Cited

U.S. PATENT DOCUMENTS

| | | | |
|---|---|---|---|
| 9,184,178 B2 | 11/2015 | Jang et al. | |
| 9,406,692 B2 | 8/2016 | Lee | |
| 10,163,930 B2 | 12/2018 | Lee | |
| 10,475,804 B1 | 11/2019 | Nishikawa et al. | |
| 10,475,806 B2 | 11/2019 | Yagi et al. | |
| 10,553,599 B1 | 2/2020 | Chen et al. | |
| 10,749,042 B2 | 8/2020 | Kim et al. | |
| 2015/0194435 A1* | 7/2015 | Lee | H10B 43/35 257/329 |
| 2019/0074287 A1* | 3/2019 | Yagi | H10B 43/27 |
| 2020/0203372 A1 | 6/2020 | Lee et al. | |

FOREIGN PATENT DOCUMENTS

CN 112185968 A 1/2021

* cited by examiner

Primary Examiner — Ajay Ojha
Assistant Examiner — Hajar Kolahdouzan
(74) Attorney, Agent, or Firm — Muir Patent Law, PLLC

(57) ABSTRACT

A semiconductor device includes a stack structure, first separation patterns passing through the stack structure, a second separation pattern passing through at least a portion of the stack structure between the first separation patterns, and a cutting channel structure passing through the stack structure and having an end portion partially cut by the second separation pattern. A channel layer of the cutting channel structure has a ring shape cut by the second separation pattern to have end portions of the channel layer which are spaced apart from each other.

20 Claims, 32 Drawing Sheets

SEMICONDUCTOR DEVICES AND DATA STORAGE SYSTEMS INCLUDING THE SAME

CROSS-REFERENCE TO RELATED APPLICATION(S)

This application claims benefit of priority to Korean Patent Application No. 10-2021-0075366 filed on Jun. 10, 2021 in the Korean Intellectual Property Office, the disclosure of which is incorporated herein by reference in its entirety.

BACKGROUND

The present inventive concept relates to a semiconductor device and a data storage system including the same.

In a data storage system having data storage, a semiconductor device capable of storing high-capacity data is desirable. A method of increasing data storage capacity of a semiconductor device is being researched. For example, as a method for increasing the data storage capacity of a semiconductor device, a semiconductor device including three-dimensionally arranged memory cells, instead of two-dimensionally arranged memory cells, has been proposed.

SUMMARY

An aspect of the present inventive concept is to provide a semiconductor device having improved electrical characteristics and reliability.

An aspect of the present inventive concept is to provide a data storage system including a semiconductor device having improved electrical characteristics and reliability.

According to an aspect of the present inventive concept, a semiconductor device includes a stack structure including a plurality of interlayer insulating layers and a plurality of gate electrodes, alternately spaced apart from each other and stacked in a vertical direction, perpendicular to an upper surface of a substrate, a plurality of first separation patterns passing through the stack structure in the vertical direction and extending in a first direction, parallel to the upper surface of the substrate, a plurality of channel structures passing through the stack structure in the vertical direction between the first separation patterns, and a second separation pattern extending between a pair of first separation patterns of the plurality of the first separation patterns in the first direction, and passing through at least one upper gate electrode including an uppermost gate electrode, among the plurality of gate electrodes, in the vertical direction. The plurality of channel structures include a first channel structure spaced apart from the second separation pattern and a second channel structure having an upper region contacting the second separation pattern. The first channel structure includes a first core insulating layer, a first channel layer covering an outer side surface of the first core insulating layer, and a first gate dielectric layer covering an outer side surface of the first channel layer. The second channel structure includes a second core insulating layer, a second channel layer covering an outer side surface of the second core insulating layer, and a second gate dielectric layer covering an outer side surface of the second channel layer. The first gate dielectric layer includes a first tunneling layer, a first data storage layer, and a first blocking layer, sequentially arranged from the outer side surface of the first channel layer toward the plurality of gate electrodes. The second gate dielectric layer includes a second tunneling layer, a second data storage layer, and a second blocking layer, sequentially arranged from the outer side surface of the second channel layer to the plurality of gate electrodes. In a plan view, parallel to the upper surface of the substrate, each of the second tunneling layer, the second data storage layer, the second blocking layer, and the second channel layer, in the upper region of the second channel structure, has end portions spaced apart from each other. In the plan view, the end portions of the second channel layer are recessed away from the end portions of at least one of the second tunneling layer, the second data storage layer, and the second blocking layer in a second direction different from the first direction.

According to an aspect of the present inventive concept, a semiconductor device includes a stack structure including a plurality of interlayer insulating layers and a plurality of gate electrodes, alternately spaced apart from each other and stacked in a direction, perpendicular to an upper surface of a substrate, a plurality of first separation patterns passing through the stack structure in a vertical direction and extending in a first direction, parallel to the upper surface of the substrate, a second separation pattern passing through at least a portion of the stack structure between a pair of first separation patterns of the plurality of first separation patterns in the vertical direction and extending in the first direction, a cutting channel structure passing through the stack structure in the vertical direction, having an end portion partially cut by the second separation pattern, and including a channel layer, and a plurality of bit lines disposed on the stack structure and the cutting channel structure, electrically connected to the channel layer of the cutting channel structure, and extending in a second direction which is parallel to the upper surface of the substrate and is perpendicular to the first direction. The cutting channel structure includes a tunneling layer, a data storage layer, and a blocking layer, sequentially arranged from an outer side surface of the channel layer to the plurality of gate electrodes. In a plan view, parallel to the upper surface of the substrate, the channel layer, in an upper region of the cutting channel structure, has a ring shape cut by the second separation pattern so that the channel layer has end portions spaced apart from each other. The end portions of the channel layer contact the second separation pattern. In the plan view, the end portions of the channel layer are spaced apart from an extension line of a first interface at which the data storage layer and the second separation pattern are in contact with each other in the second direction away from an outer side surface of the second separation pattern.

According to an aspect of the present inventive concept, a data storage system includes a semiconductor storage device and a controller. The semiconductor storage device includes a first structure including a lower substrate, circuit elements on the lower substrate, and a lower wiring structure electrically connected to the circuit elements, a second structure on the first structure, and an input/output pad electrically connected to the circuit elements. The controller is electrically connected to the semiconductor storage device through the input/output pad and controls the semiconductor storage device. The second structure comprises an upper substrate a stack structure including a plurality of interlayer insulating layers and a plurality of gate electrodes, alternately spaced apart from each other and stacked in a vertical direction, perpendicular to an upper surface of the upper substrate, a plurality of first separation patterns passing through the stack structure in the vertical direction and extending in a first direction, parallel to the upper surface of the upper substrate, a second separation pattern passing through at least a portion of the stack structure between a pair of first separation patterns of the plurality of first separation patterns in the vertical direction and extending in the first direction, a cutting channel structure passing through the stack structure in the vertical direction, having an end portion partially cut by the second separation pattern, and including a channel layer; and a plurality of bit lines disposed on the stack structure and the cutting channel structure, electrically connected to the channel layer of the cutting channel structure, and extending in a second direction which is parallel to the upper surface of the upper substrate and is perpendicular to the first direction. The cutting channel structure includes a tunneling layer, a data storage layer, and a blocking layer, sequentially arranged from an outer side surface of the channel layer to the plurality of gate electrodes. In a plan view, parallel to the upper surface of the upper substrate, the channel layer, in an upper region of the cutting channel structure, has a ring shape cut by the second separation pattern so that the channel layer has end portions spaced apart from each other. The end portions of the channel layer in the upper region of the cutting channel structure contact the second separation pattern. In the plan view, the end portions of the channel layer are spaced apart from an extension line of an interface at which the data storage layer and the second separation pattern are in contact with each other in the second direction away from an outer side surface of the second separation pattern.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, preferred embodiments of the present inventive concept will be described with reference to the accompanying drawings.

Figure 1:
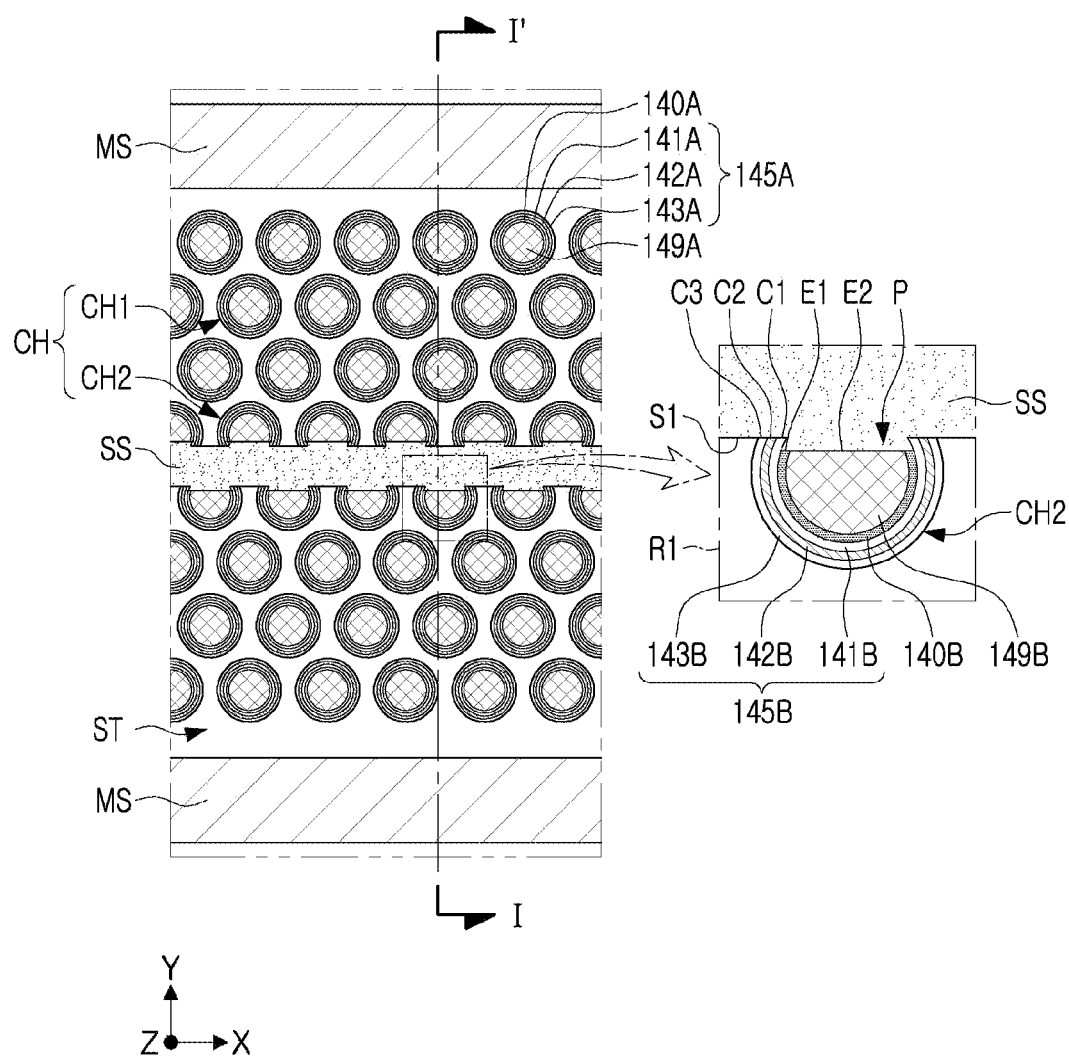
FIG. 1 is a schematic plan view of a semiconductor device according to example embodiments.

FIG. 1 is a schematic plan view of a semiconductor device according to example embodiments.

Figure 2:
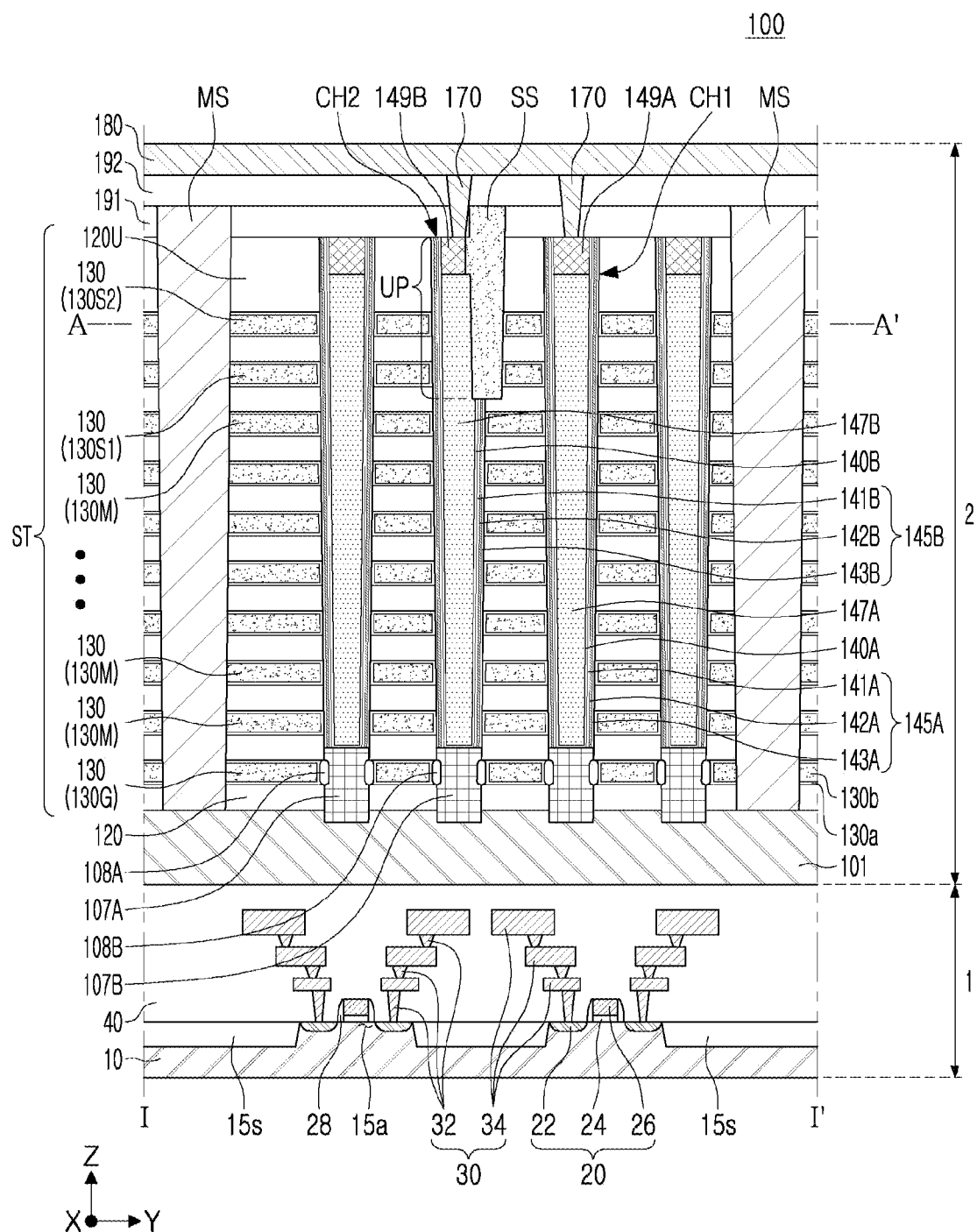
FIG. 2 is a schematic cross-sectional view of a semiconductor device according to example embodiments.

FIG. 2 is a schematic cross-sectional view of a semiconductor device according to example embodiments. FIG. 2 illustrates a cross-sectional view taken along line I-I' of FIG. 1.

Figure 3:
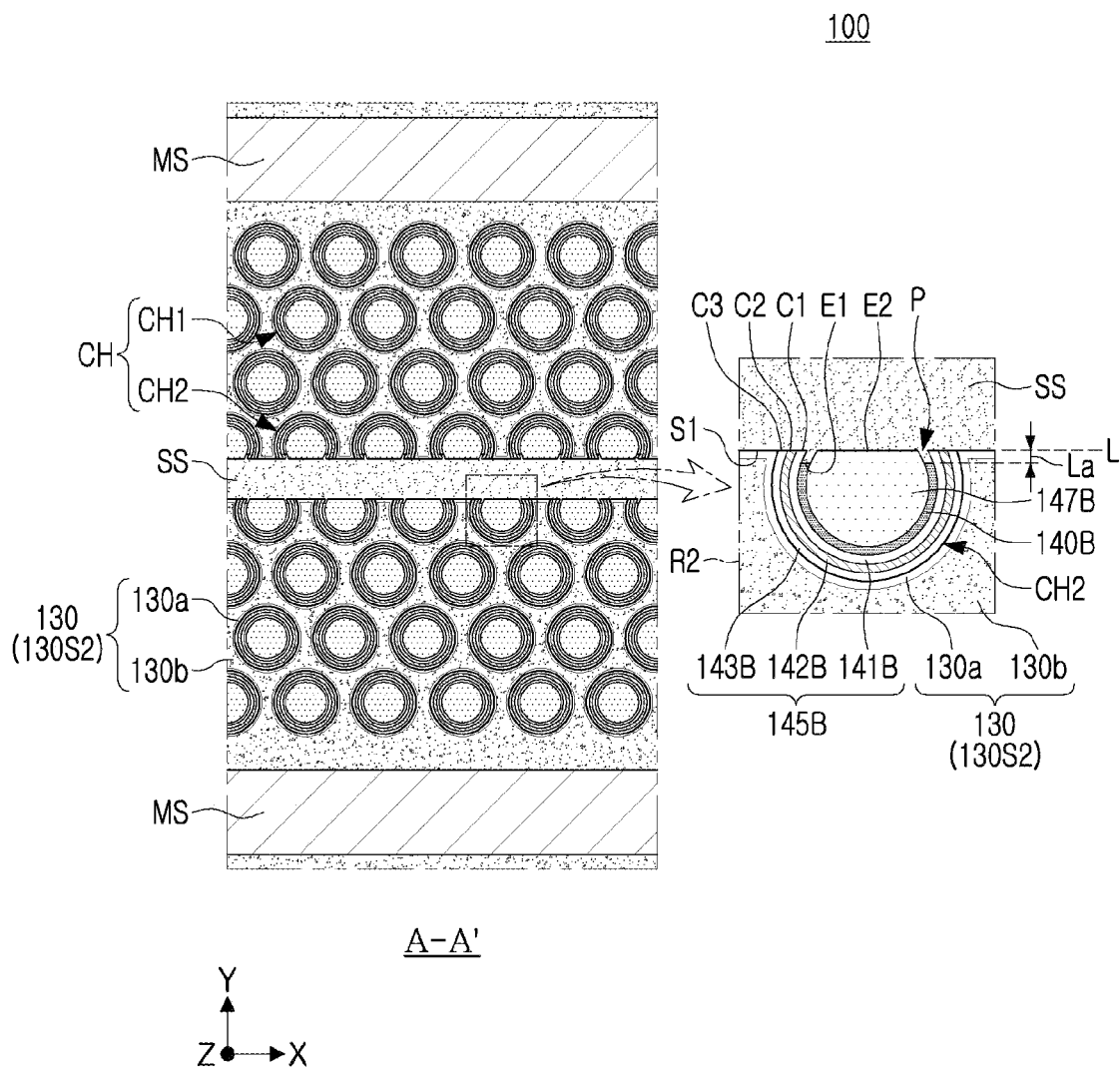
FIG. 3 is a schematic horizontal cross-sectional view of a semiconductor device according to example embodiments.

FIG. 3 is a schematic horizontal cross-sectional view of a semiconductor device according to example embodiments. FIG. 3 illustrates a cross-sectional view of the semiconductor device at a level corresponding to line A-A' in FIG. 2, in a plan view.

Referring to FIGS. 1 to 3, a semiconductor device 100 may include a first structure 1 including a lower substrate 10 and a second structure 2 including an upper substrate 101. The second structure 2 may be disposed on the first structure 1. The first structure 1 may be a region in which a peripheral circuit region of the semiconductor device 100 is disposed, and a row decoder, a page buffer, other peripheral circuits, and the like may be disposed in the first structure 1. The second structure 2 may be a region in which memory cells of the semiconductor device 100 are disposed, and gate electrodes 130, channel structures CH, and the like may be disposed in the second structure 2. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The first structure 1 may include a lower substrate 10, device isolation layers 15s defining an active region 15a at the lower substrate 10, circuit elements 20 disposed at the substrate 10, a lower wiring structure 30 electrically connected to the circuit elements 20, and a lower capping insulating layer 40.

The lower substrate 10 may include or may be formed of a semiconductor material, for example, a group IV semiconductor, a group III-V compound semiconductor, or a group II-VI compound semiconductor. The lower substrate 10 may be provided as a bulk wafer or an epitaxial layer. The lower substrate 10 may be disposed below an upper substrate 101. The device isolation layers 15s may be disposed in the lower substrate 10, and source/drain regions 22 including impurities may be disposed in a portion of the active region 15*a*.

The circuit elements 20 may each include a transistor including a source/drain region 22, a circuit gate dielectric layer 24, and a circuit gate electrode 26. The source/drain regions 22 may be disposed on opposite sides of the circuit gate electrode 26 in the active region 15*a*. The circuit gate dielectric layer 24 may be disposed between the active region 15*a* and the circuit gate electrode 26. Spacer layers 28 may be disposed on opposite sides of the circuit gate electrode 26. The circuit gate electrode 26 may include or may be formed of, for example, a material layer such as tungsten (W), titanium (Ti), tantalum (Ta), tungsten nitride (WN), titanium nitride (TiN), tantalum nitride (TaN), polycrystalline silicon, and a metal-semiconductor compound.

The lower wiring structure 30 may be electrically connected to the circuit elements 20. The lower wiring structure 30 may include a lower contact 32 and a lower wiring 34. A portion of lower contacts 32 may extend in a Z direction to be connected to the source/drain regions 22. The lower contact 32 may electrically connect the lower wirings 34 disposed on different levels with each other. The lower wiring structure 30 may include or may be formed of a conductive material, for example, a metal material such as tungsten (W), titanium (Ti), tantalum (Ta), copper (Cu), aluminum (Al), cobalt (Co), molybdenum (Mo), and ruthenium (Ru). A barrier layer formed of a material such as tungsten nitride (WN), titanium (Ti), and titanium nitride (TiN) may be disposed on bottom and side surfaces of the lower wiring structure 30. The number of layers and arrangement of the lower contacts 32 and the lower wirings 34, constituting the lower wiring structure 30, may be variously changed. At least a portion of the lower wirings 34 may include a pad layer to which a plurality of through-contact plugs extending downwardly from the second structure 2 are connected. The plurality of through-contact plugs may be disposed to pass through a separate through-region formed in a stack structure ST of the second structure 2. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The lower capping insulating layer 40 may be disposed to cover the lower substrate 10, the circuit elements 20, and the lower wiring structure 30. The lower capping insulating layer 40 may be formed of an insulating material such as silicon oxide and silicon nitride. The lower capping insulating layer 40 may include a plurality of insulating layers. The lower capping insulating layer 40 may include or may be formed of an etch stop layer formed of silicon nitride.

The second structure 2 may include an upper substrate 101 on the first structure 1, a stack structure ST including gate electrodes 130 spaced apart from each other and stacked on the upper substrate 101, first separation patterns MS passing through the stack structure ST and separating the gate electrodes 130, channel structures CH passing through the stack structure ST, a second separation pattern SS separating upper gate electrodes 130S1 and 130S2 among the gate electrodes 130 between the first separation patterns MS, and bit lines 180 disposed on the stack structure ST. The second structure 2 may further include interlayer insulating layers 120 with which the gate electrodes 130 are alternately stacked on each other to form the stack structure ST, and contact plugs 170 and upper insulating layers 191 and 192, arranged between the channel structures CH and the bit lines 180.

The upper substrate 101 may include or may be formed of a semiconductor material, for example, a group IV semiconductor, a group III-V compound semiconductor, or a group II-VI compound semiconductor. The upper substrate 101 may include or maybe formed of, for example, a polycrystalline silicon layer having N-type or P-type conductivity.

The gate electrodes 130 may be stacked on the upper substrate 101 to be spaced apart from each other in the Z direction, and may form a portion of the stack structure ST. The gate electrodes 130 may extend in the X direction. The gate electrodes 130 may include a lower gate electrode 130G forming a gate of a ground select transistor, memory gate electrodes 130M forming a plurality of memory cells, and upper gate electrodes 130S1 and 130S2 forming gates of string select transistors. The number of the memory gate electrodes 130M constituting the memory cells may be determined according to the capacity of the semiconductor device 100. In some embodiments, the number of each of the gate electrodes 130 constituting the string select transistor and the ground select transistor may be one, or two or more.

The gate electrodes 130 may be vertically spaced apart from each other and stacked on the upper substrate 101, and although not illustrated, may extend by different lengths in a Y direction to form a stepped structure having a step shape. The gate electrodes 130 may have pad regions in which a lower gate electrode among the gate electrodes 130 is extended to be longer than an upper gate electrode among the gate electrodes 130 due to the stepped structure. The gate electrodes 130 may be connected to gate contact plugs at the pad regions. The gate contact plugs may be electrically connected to the circuit elements 20 of the first structure 1 through through-contact plugs passing through a separate through-region disposed in the stack structure ST.

The gate electrodes 130 may be arranged to be separated from each other in the Y direction by the first separation patterns MS extending in an X direction. The gate electrodes 130 between a pair of first separation patterns MS may form one memory block, but a scope of the memory block is not limited thereto. Each of the gate electrodes 130 may include a first layer 130*a* and a second layer 130*b*. The first layer 130*a* may cover upper and lower surfaces of the second layer 130*b*, and may extend between the channel structures CH and the second layer 130*b*. The first layer 130*a* may include or may be formed of a high-k material such as aluminum oxide (AlO), and the second layer 130*b* may include or may be formed of at least one of titanium (Ti), titanium nitride (TiN), tantalum (Ta), tantalum nitride (TaN), tungsten (W), and tungsten nitride (WN). In some embodiments, the gate electrodes 130 may include or may be formed of polycrystalline silicon or a metal-semiconductor compound.

The interlayer insulating layers 120 may be disposed between the gate electrodes 130, and may form the stack structure ST. Like the gate electrodes 130, the interlayer insulating layers 120 may be spaced apart from each other in the Z direction, and may be disposed to extend in the X direction. The interlayer insulating layers 120 may include or may be formed of an insulating material such as silicon oxide. An uppermost interlayer insulating layer 120U among the interlayer insulating layers 120 may have a thickness, greater than a thickness of each of the other interlayer insulating layers 120. A portion of the interlayer insulating layers 120 may have different thicknesses.

The first separation patterns MS may be disposed to pass through the gate electrodes 130 of the stack structure ST in the Z direction, and extend in the X direction. First separation patterns MS adjacent in the Y direction may be disposed parallel to each other. The first separation patterns MS may entirely pass through the gate electrodes 130 of the stack structure ST in the Z direction, to contact the upper substrate 101. The first separation patterns MS may be formed of an insulating material, for example, silicon oxide. In some embodiments, each of the first separation patterns MS may include a core pattern including a conductive material and contacting the upper substrate 101, and a separation insulation pattern covering a side surface of the core pattern and including an insulating material.

As illustrated in FIG. 1, the channel structures CH may form a memory cell string, and may be disposed to be spaced apart from each other while forming rows and columns. The channel structures CH may be disposed to form a grid pattern between the first separation patterns MS or may be disposed to form a zigzag pattern in one direction. The channel structures CH may pass through the stack structure ST in the Z direction. The channel structures CH may have a pillar shape, and may have inclined side surfaces, narrower in width, as they approach the upper substrate 101 according to an aspect ratio of the channel structures CH.

The channel structures CH may include a first channel structure CH1 and a second channel structure CH2. The first channel structure CH1 may be disposed to be spaced apart from the second separation pattern SS between the first separation patterns MS. The second channel structure CH2 may be disposed between the first channel structure CH1 and the second separation pattern SS. The second channel structure CH2 may have an upper region UP contacting the second separation pattern SS between the first separation patterns MS. The first channel structure CH1 and the second channel structure CH2 may be disposed in plural. The second channel structure CH2 may not be a dummy channel structure. A dummy channel structure does not perform a substantial function in the semiconductor device 100. As used herein, the term "dummy" is used to refer to a component that has the same or similar structure and shape as other components but does not have a substantial function and exists only as a pattern in the device. For example, the second channel structure CH2 may be electrically connected to the bit lines 180 thereon, and may be used as a channel structure of actual memory cells, instead of a dummy channel structure. Therefore, more channel structures CH may be formed between the pair of second separation patterns MS, and thus a degree of integration of the semiconductor device 100 may increase. The second channel structure CH2 may have an end partially cut in the upper region UP by the second separation pattern SS. In this specification, the second channel structure CH2 may be referred to as a "cutting channel structure."

The first channel structure CH1 may include a first channel layer 140A, a first gate dielectric layer 145A, a first core insulating layer 147A, and a first channel pad 149A. The first channel layer 140A may be formed to have an annular shape covering or surrounding an outer side surface of the first core insulating layer 147A. The first gate dielectric layer 145A may cover an outer side surface of the first channel layer 140A. The first gate dielectric layer 145A may include a first tunneling layer 141A, a first data storage layer 142A, and a first blocking layer 143A, sequentially arranged from the outer side surface of the first channel layer 140A to the gate electrodes 130. The first channel pad 149A may be disposed on the first core insulating layer 147A, and may be in contact with the first channel layer 140A. The first channel structure CH1 may further include a first epitaxial layer 107A connected to the upper substrate 101 and contacting a lower end of the first channel layer 140A.

The first channel layer 140A and the first gate dielectric layer 145A may have a ring shape forming a single closed curve, in a plan view. In some embodiments, the first channel layer 140A and the first gate dielectric layer 145A may have a ring shape of a circle or an ellipse. The first core insulating layer 147A and the first channel pad 149A may be disposed on an inner side surface of the first channel layer 140A, and may have a circular shape or an elliptical shape, in a plan view.

As illustrated in a partially enlarged region R1 of FIG. 1 and a partially enlarged region R2 of FIG. 3, the second channel structure CH2 may include a second channel layer 140B, a second gate dielectric layer 145B, a second core insulating layer 147B, and a second channel pad 149B. The second channel layer 140B may be formed to have an annular shape covering or surrounding an outer side surface of the second core insulating layer 147B. The second gate dielectric layer 145B may cover an outer side surface of the second channel layer 140B. The second gate dielectric layer 145B may include a second tunneling layer 141B, a second data storage layer 142B, and a second blocking layer 143B, sequentially arranged from the outer side surface of the second channel layer 140B to the gate electrodes 130. As illustrated in FIG. 2, the second channel pad 149B may be disposed on the second core insulating layer 147B, and may be in contact with the second channel layer 140B. The second channel structure CH2 may further include a second epitaxial layer 107B connected to the upper substrate 101 and contacting a lower end of the second channel layer 140B.

In a plan view parallel to an upper surface of the upper substrate 101, the second tunneling layer 141B, the second data storage layer 142B, and the second blocking layer 143B may have end portions C1, C2, and C3 cut by the second separation pattern SS, in the upper region UP of the second channel structure CH2, respectively. The end portions C1, C2, and C3 may be in contact with a side surface S1 of the second separation pattern SS. The second tunneling layer 141B, the second data storage layer 142B, and the second blocking layer 143B may be cut by the second separation pattern SS to have a ring shape cut to expose the end portions C1, C2, and C3, respectively. Each of the second channel layer 140B and the second gate dielectric layer 145B may have a connected ring shape in a lower region of the second channel structure CH2. In the present specification, unless otherwise specified, the upper region UP of the second channel structure CH2 may be described, based on the semiconductor device 100 or a horizontal cut surface of the semiconductor device 100, in a plan view (FIGS. 1 and 3). In the upper region UP of the second channel structure CH2, the second channel layer 140B may have a recessed region or an end portion E1 recessed in a direction away from an outer side of the second separation pattern SS, compared to at least one end portion among the end portions C1, C2 and C3, for example, in a direction away from the second separation pattern SS. In the upper region UP of the second channel structure CH2, the recess region or the end portion E1 may be recessed in a direction away from the outer side of the second separation pattern SS, compared to each portions in which the gate electrodes 130 and the second core insulating layer 147B are in contact with the side surface S1 of the second separation pattern SS. In some embodiments, the second channel layer 140B may be recessed from the end portions C1, C2, and C3 of the second gate dielectric layer 145B.

In the upper region UP of the second channel structure CH2, the second channel layer 140B may have a broken ring shape to expose end portions E1, and the end portions E1 may be spaced apart from each other in a direction away from the outer side of the second separation pattern SS, compared to an extension line L of an interface on which the second data storage layer 142B and the second separation pattern SS are in contact with each other. The interface may be a surface in which end portions C2 of the second data storage layer 142B are in contact with the second separation pattern SS. In the upper region UP of the second channel structure CH2, the second channel layer 140B may have a ring shape cut by the second separation pattern SS. During a write operation of the semiconductor device 100, electrons may be more easily tunneled from the second channel layer 140B to the second data storage layer 142B by strengthening a local electric field of the second tunneling layer 141B adjacent to the end portion E1 of the second channel layer 140B.

In the upper region UP of the second channel structure CH2, the second core insulating layer 147B and the second channel pad 149B may have a bow shape, e.g., a segment of a circle. For example, the second channel pad 149B may have an end portion E2 cut along a chord, connecting two points on a circumference of the second channel pad 149B, in the Z direction. The end portion E2 of the second channel pad 149B may be recessed in a direction away from the outer side of the second separation pattern SS, compared to at least one of the end portions C1, C2, and C3. The end portion E2 of the second channel pad 149B may be spaced apart from the extension line L of the interface in a direction away from the outer side of the second separation pattern SS.

In an example embodiment, a length La from the extension line L of the interface to the region E1 in which the second channel layer 140B is recessed in a direction away from the outer side of the second separation pattern SS may be about 1 nm to about 30 nm. In an example embodiment, the length La may range from about 8 nm to about 12 nm. When the length La is shorter than the above range, an effect of increasing a threshold voltage of a string select transistor may be insignificant. A maximum value of the length La may be determined in consideration of a diameter of the channel structure CH2. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The channel layers 140A and 140B may include or may be formed of a semiconductor material such as polycrystalline silicon and single crystal silicon. The channel pads 149A and 149B may include or may be formed of, for example, doped polycrystalline silicon. The channel pads 149A and 149B may include or may be formed of a semiconductor material such as polycrystalline silicon and monocrystalline silicon, and may include or may be formed of, for example, doped polycrystalline silicon. The tunneling layers 141A and 141B may tunnel electric charges into the data storage layers 142A and 142B, and may include or may be formed of, for example, silicon oxide ($SiO_2$), silicon nitride ($Si_3N_4$), silicon oxynitride (SiON), or a combination thereof. The data storage layers 142A and 142B may be a charge trap layer or a floating gate conductive layer. The blocking layers 143A and 143B may include or may be formed of silicon oxide ($SiO_2$), silicon nitride ($Si_3N_4$), silicon oxynitride (SiON), a high-k dielectric material, or a combination thereof. In example embodiments, at least a portion of the gate dielectric layers 145A and 145B may extend along the gate electrodes 130 in a horizontal direction.

The epitaxial layers 107A and 107B may be disposed to contact the upper substrate 101 on a lower end of the channel structure CH, and may be disposed adjacent to a side surface of at least one gate electrode among the gate electrodes 130. The epitaxial layers 107A and 107B may be disposed in the recessed region of the upper substrate 101. Upper surfaces of the epitaxial layers 107A and 107B may be higher than an upper surface of a lowermost gate electrode 130, and may be lower than the lower surface of a gate electrode 130, disposed on the lowermost gate electrode 130. The present invention, however, is not limited thereto. The epitaxial layers 107A and 107B may be connected to the channel layers 140A and 140B through the upper surfaces thereof, respectively. The channel structures CH may further include channel-lower insulating layers 108A and 108B disposed between the epitaxial layers 107A and 107B and the lower gate electrode 130G adjacent to the epitaxial layers 107A and 107B. The channel-lower insulating layers 108A and 108B may include or may be formed of an insulating material such as silicon oxide.

The second separation pattern SS may extend between the first separation patterns MS in the X direction. The second separation pattern SS may pass through gate electrodes 130 in an upper portion, among the gate electrodes 130, in the Z direction, to separate the gate electrodes 130 from each other in the Y direction. The number of gate electrodes 130 in the upper portion, separated by the second separation pattern SS, may be variously changed in some embodiments. The gate electrodes 130 in the upper portion, separated by the second separation pattern SS, may form different string select lines. The second separation pattern SS may include or may be formed of an insulating material, for example, silicon oxide, silicon nitride, or silicon oxynitride.

The second separation pattern SS may be disposed to partially overlap the second channel structure CH2 in the Z direction, in a plan view. The second separation pattern SS may be in contact with the upper region UP of the second channel structure CH2. In a plan view, the second separation pattern SS extends between the second core insulating layer 147B and the second tunneling layer 141B to include a protrusion P filling the recess region to contact the end portion E1 of the second channel layer 140B. In a plan view, the protrusion P of the second separation pattern SS may extend from a portion contacting the end portion C1 of the second tunneling layer 141B along an inner side surface of the second tunneling layer 141B. The protrusion P may protrude beyond the side surface S1 of the second separation pattern SS toward the end portion E1 of the second channel layer 140B. The protrusion P may have a first region contacting the end portion E1 of the second channel layer 140B and a second region contacting the end portion E2 of the second channel pad 149B, on a level on which the second channel pad 149B is disposed.

The second separation pattern SS may be spaced apart from the upper substrate 101. Based on the upper surface of the upper substrate 101, an upper surface of the second separation pattern SS may be located on a higher level than an upper surface of the second channel structure CH2. The upper surface of the second separation pattern SS may be disposed on a level, substantially the same as, higher than, or lower than a level of the upper surface of the first separation pattern MS. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The contact plugs 170 may be disposed between the channel structures CH and the bit lines 180. The contact plugs 170 may be respectively connected to the first channel pad 149A and the second channel pad 149B. The contact plugs 170 may be connected to the bit lines 180. The contact plugs 170 may pass through at least one of the upper insulating layers 191 and 192, for example, a first upper insulating layer 191 and a second upper insulating layer 192 in the Z direction. In some embodiments, a plurality of studs connected to the contact plugs 170 may be further disposed between one channel structure CH and one bit line 180.

The contact plugs 170 may include a conductive pattern and a barrier layer covering side and bottom surfaces of the conductive pattern. The barrier layer may include or may be formed of, for example, at least one of titanium (Ti), titanium nitride (TiN), tantalum (Ta), and tantalum nitride (TaN). The conductive pattern may include or may be formed of a metal material, for example, at least one of tungsten (W), titanium (Ti), copper (Cu), cobalt (Co), aluminum (Al), and an alloy thereof.

The bit lines 180 may be disposed on the stack structure ST and the channel structures CH, and may extend in the Y direction. The bit lines 180 may be electrically connected to the circuit elements 20 of the first structure 1 through separate through-contact plugs. The bit lines 180 may be electrically connected to the channel layers 140A and 140B.

The bit lines 180 may include a conductive pattern and a barrier layer covering side and bottom surfaces of the conductive pattern. The barrier layer may include or may be formed of, for example, at least one of titanium (Ti), titanium nitride (TiN), tantalum (Ta), and tantalum nitride (TaN). The conductive pattern may include or may be formed of a metal material, for example, at least one of tungsten (W), titanium (Ti), copper (Cu), cobalt (Co), aluminum (Al), and an alloy thereof.

The upper insulating layers 191 and 192 may be disposed on the stack structure ST. The upper insulating layers 191 and 192 may include a first upper insulating layer 191 and a second upper insulating layer 192, sequentially stacked on the stack structure ST. The upper insulating layers 191 and 192 may be formed of an insulating material such as silicon oxide.

Figure 4A:
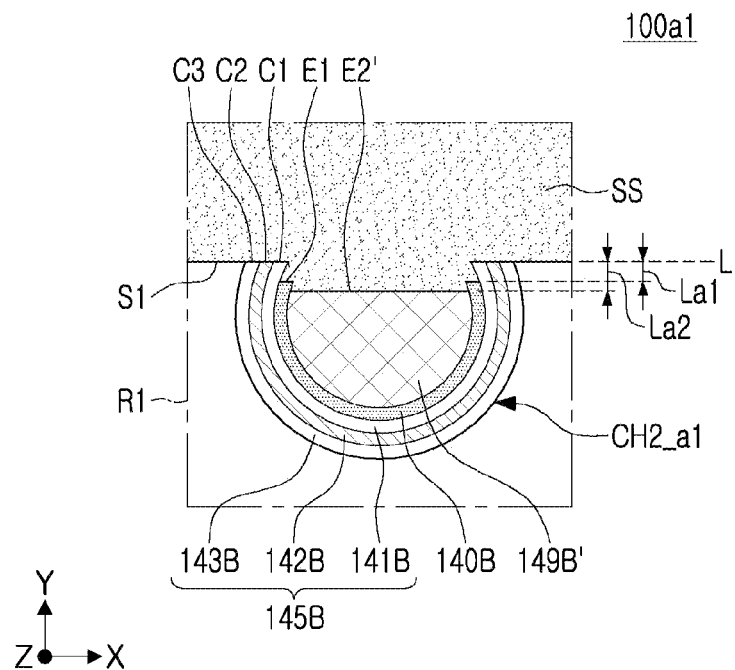
FIGS. 4A and 4B are partially enlarged plan views of a semiconductor device according to example embodiments.
Figure 4B:
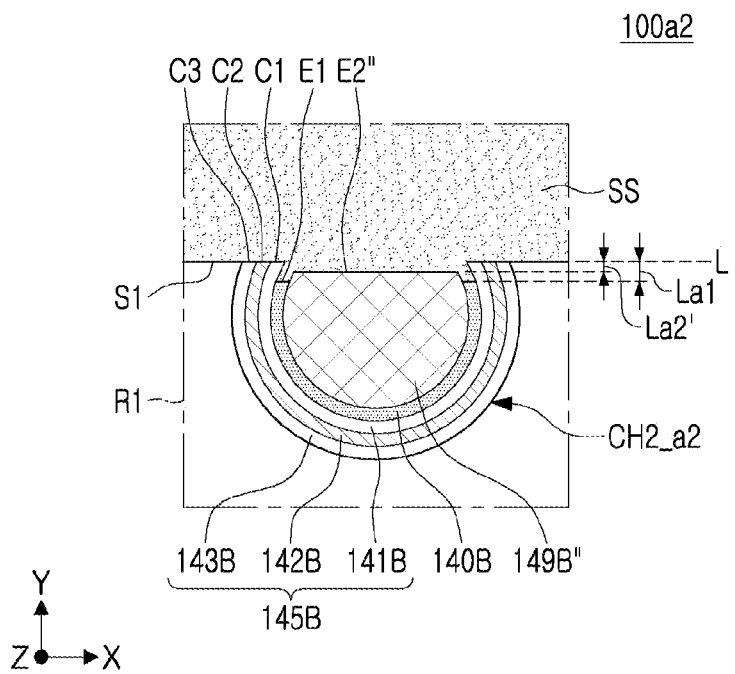

FIGS. 4A and 4B are partially enlarged plan views of a semiconductor device according to example embodiments. FIGS. 4A and 4B illustrate a region corresponding to the region R1 of FIG. 1.

Referring to FIGS. 4A and 4B, in upper regions UP of second channel structures CH2_a1 and CH2_a2, end portions E1 of second channel layer 140B and end portions E2' and E2" of second channel pads 149B' and 149B" may be spaced apart from each other by different lengths, respectively, in a direction away from an outer side of a second separation pattern SS from an extension line L of an interface on which a second data storage layer 142B and the second separation pattern SS.

As illustrated in FIG. 4A, in a semiconductor device 100a1, an end portion E2' of the second channel pad 149B' may be located farther away from the extension line L, compared to end portions E1 of the second channel layer 140B. A length La1 from the extension line L of the interface to the end portions E1 in which the second channel layer 140B is recessed may be shorter than a length La2 from the extension line L of the interface to the end portion E2' in which the second channel pad 149B' is recessed.

As illustrated in FIG. 4B, in a semiconductor device 100a2, an end portion E2" of the second channel pad 149B" may be located closer to the extension line L, compared to end portions E1 of the second channel layer 140B. A length La1' from the extension line L of the interface to the end portions E1 in which the second channel layer 140B is recessed may be longer than a length La2' from the extension line L of the interface to the end portion E2" in which the second channel pad 149B" is recessed.

The end portions E2' and E2" of the second channel pads 149B' and 149B" may have a flat surface. The present invention, however, is not limited thereto. In some embodiments, the end portions E2' and E2" of the second channel pads 149B' and 149B" may have a curved surface to be concave in a direction away from an inner side of the second channel pads 149B' and 149B" or may have a curved surface to be convex in a direction away from an outer side of the second channel pads 149B' and 149B", respectively.

Figure 5A:
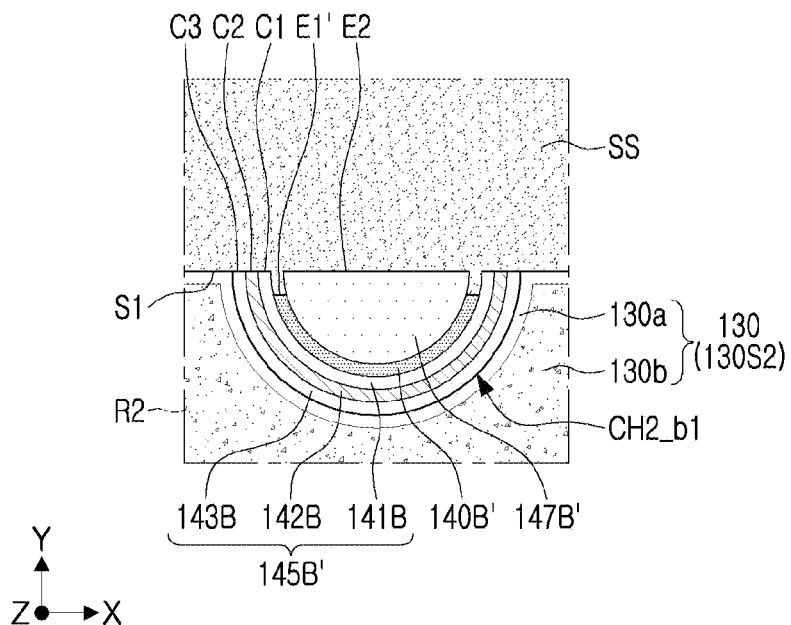
FIGS. 5A, 5B, and 5C are partially enlarged horizontal cross-sectional views of semiconductor devices according to example embodiments.
Figure 5B:
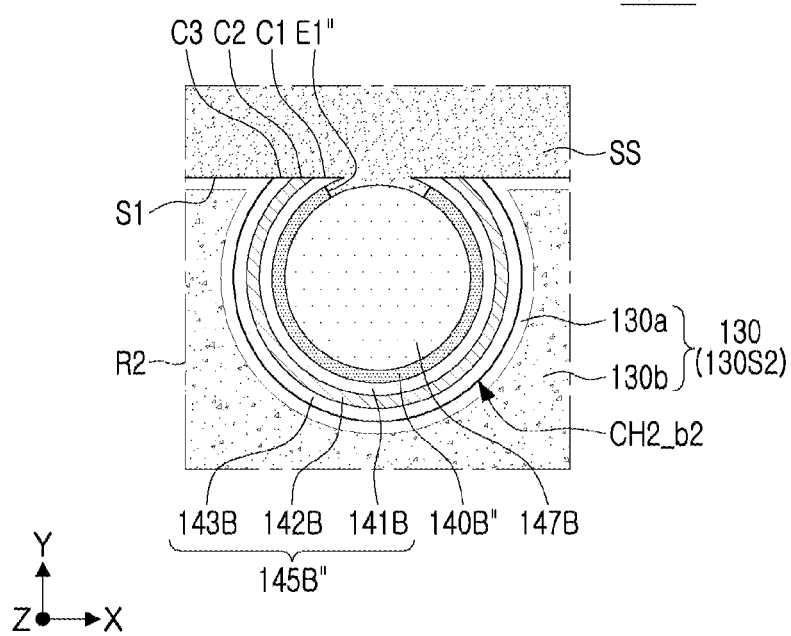
Figure 5C:
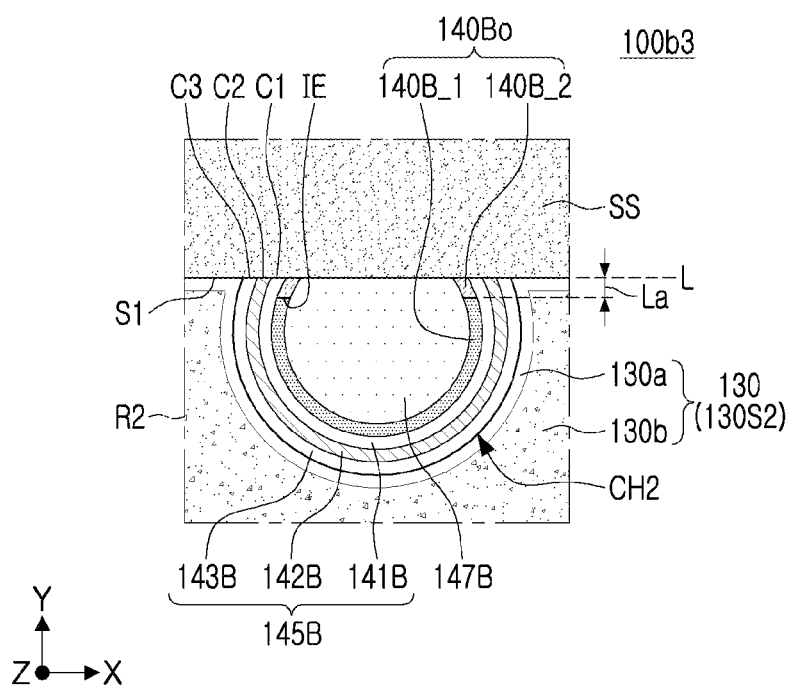

FIGS. 5A, 5B, and 5C are partially enlarged horizontal cross-sectional views of semiconductor devices according to example embodiments. FIGS. 5A, 5B, and 5C illustrate a region corresponding to the region R2 of FIG. 3.

Referring to FIGS. 5A and 5B, a degree to which a second separation pattern SS and second channel structures CH2_b1 and CH2_b2 partially overlap in the Z direction, may be different from the previous embodiments.

For example, as illustrated in FIG. 5A, in a semiconductor device 100b1, the second separation pattern SS may be disposed to overlap a region of about half of the second channel structure CH2_b1, and a second core insulating layer 147B' may have a semicircular shape, in a plan view. An end portion E1' of a second channel layer 140B' may be recessed in a direction away from an outer side of the second separation pattern SS, compared to at least one of end portions C1, C2, and C3 of a second gate dielectric layer 145B'.

For example, as illustrated in FIG. 5B, in a semiconductor device 100b2, a region in which the second separation pattern SS and a second channel structure CH2_b2 overlap in the Z direction may be smaller than that of the previous embodiments. An end portion E1" of a second channel layer 140B" may be recessed in a direction away from an outer side of the second separation pattern SS, compared to at least one of end portions C1, C2, and C3 of a second gate dielectric layer 145B". In FIG. 5B, a separation distance between the end portions E1" formed by recessing the second channel layer 140B" may be shorter than a separation distance corresponding thereto in FIG. 3.

Referring to FIG. 5C, in a semiconductor device 100b3, a second channel layer 140Bo may include a semiconductor region 140B_1 and an oxide region 140B_2. A boundary IE between the semiconductor region 140B_1 and the oxide region 140B_2 may be recessed in a direction away from an outer side of a second separation pattern SS, compared to at least one of end portions C1, C2, and C3 of a second gate dielectric layer 145B. The oxide region 140B_2 may be a region oxidized from a portion of a channel semiconductor layer contacting the second separation pattern SS.

Figure 6:
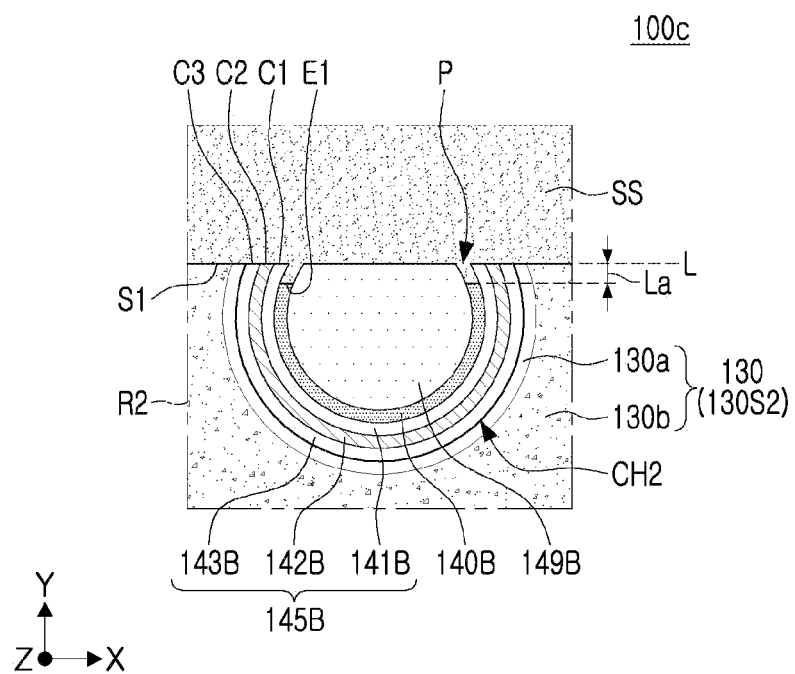
FIG. 6 is a partially enlarged horizontal cross-sectional view of a semiconductor device according to example embodiments.

FIG. 6 is a partially enlarged horizontal cross-sectional view of a semiconductor device according to example embodiments. FIG. 6 illustrates a region corresponding to the region R2 of FIG. 3.

Referring to FIG. 6, in a semiconductor device 100c, a first layer 130a constituting gate electrodes 130 may cover only a periphery of a second channel structure CH2, and may not be extended along a side surface S1 of a second separation pattern SS. In a process of manufacturing the semiconductor device of FIGS. 1 to 3, before removing sacrificial layers (refer to FIG. 20B), a second separation pattern SS may be formed. In a process of manufacturing the semiconductor device 100c of FIG. 6, after removing sacrificial layers and forming gate electrodes 130, a second separation pattern SS may be formed to separate upper gate electrodes 130S1 and 130S2 into individual gate electrodes. Therefore, the first layer 130a may not extend along the side surface S1 of the second separation pattern SS.

Figure 7A:
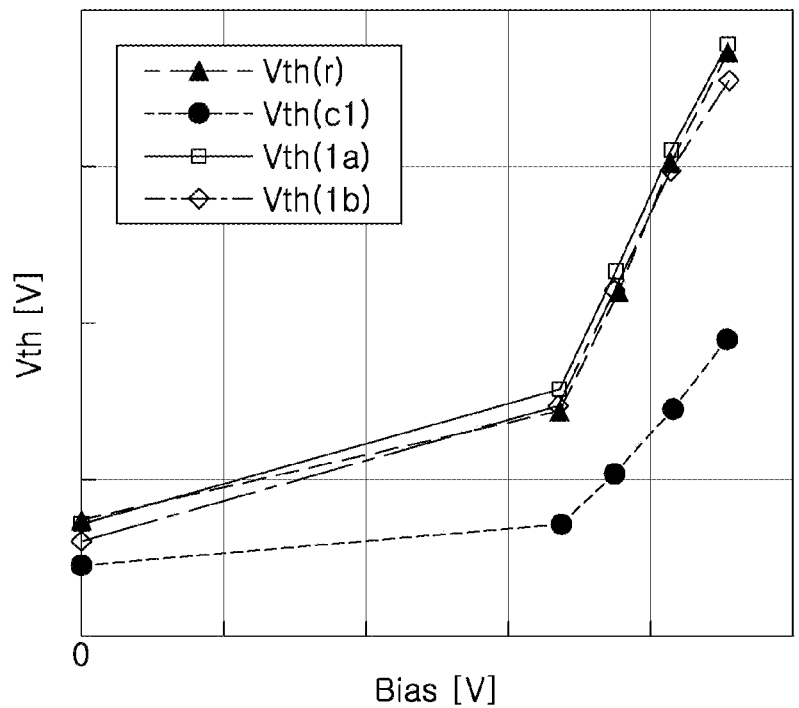
FIGS. 7A and 7B are graphs illustrating simulation results of a threshold voltage of a string select transistor provided by an upper gate electrode of a semiconductor device according to example embodiments.

FIG. 7A is a graph illustrating a simulation result of a threshold voltage of a string select transistor provided by an upper gate electrode of a semiconductor device according to example embodiments.

Figure 7B:
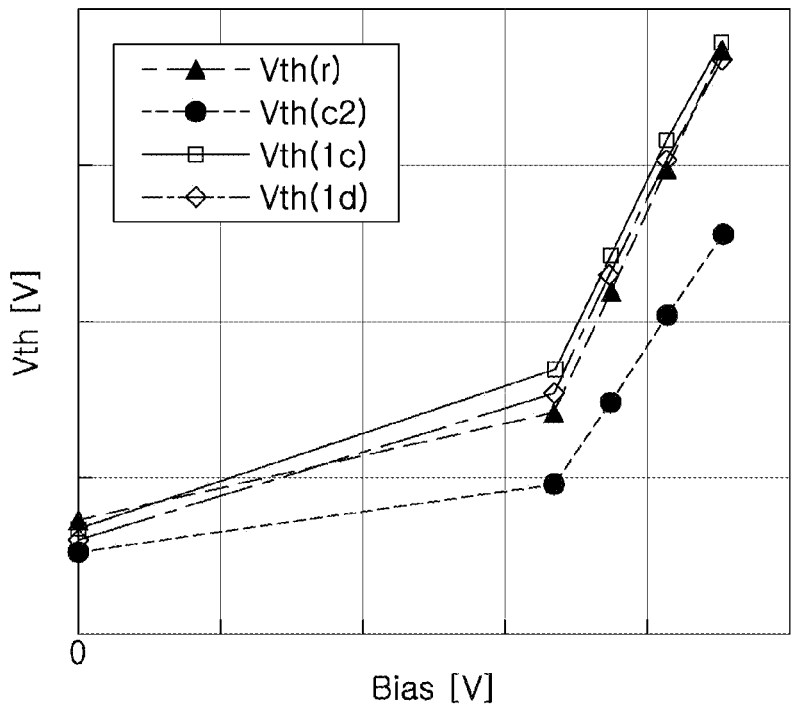

FIG. 7B is a graph illustrating a simulation result of a threshold voltage of a string select transistor provided by an upper gate electrode of a semiconductor device according to example embodiments.

FIGS. 7A and 7B illustrate changes in threshold voltage of a string select transistor with respect to a bias applied during a write operation. A reference threshold voltage $V_{th}(r)$ may refer to a threshold voltage of the string select transistor provided by an upper gate electrode during a read operation, when a second separation pattern SS does not overlap or is in contact with a channel structure CH. When the second separation pattern SS is disposed to overlap a portion (e.g., CH2) of channel structures CH, and there is no recess in the channel layer, it corresponds to a comparative example. In the comparative example, threshold voltages $V_{th}(c1)$ and $V_{th}(c2)$ of the string select transistor provided by the upper gate electrode during the read operation may be lower than the reference threshold voltage $V_{th}(r)$.

According to an example embodiment of the present inventive concept, a recess region E1 may be formed in a second channel layer 140B, to increase threshold voltages $V_{th}(1a)$, $V_{th}(1b)$, $V_{th}(1c)$, and $V_{th}(1d)$ of the string select transistor to a level of the reference threshold voltage $V_{th}(r)$ or higher, even in the second channel structure CH2. Therefore, problems that may occur during a read operation of a memory cell may be improved. Referring to FIG. 3 together, the second channel layer 140B may be recessed to receive relatively little influence of an electric field applied to a second core insulating layer 147B, to increase a threshold voltage of the string select transistor by reducing a body floating effect in the read operation. For example, FIG. 7A may correspond to the embodiment of FIGS. 1 to 3, and FIG. 7B may correspond to the embodiment of FIG. 5A.

In a relationship between a first upper gate electrode 130S1 and a second upper gate electrode 130S2, when a threshold voltage distribution occurs due to tendency of decreasing a threshold voltage, it is vulnerable to a failure in operation of the memory cell due to the distribution of the threshold voltage. According to the example embodiment of the present inventive concept, since the problem of reducing the threshold voltage of the string select transistor during the read operation may be overcome, a semiconductor device having improved electrical characteristics and reliability may be provided.

Figure 8:
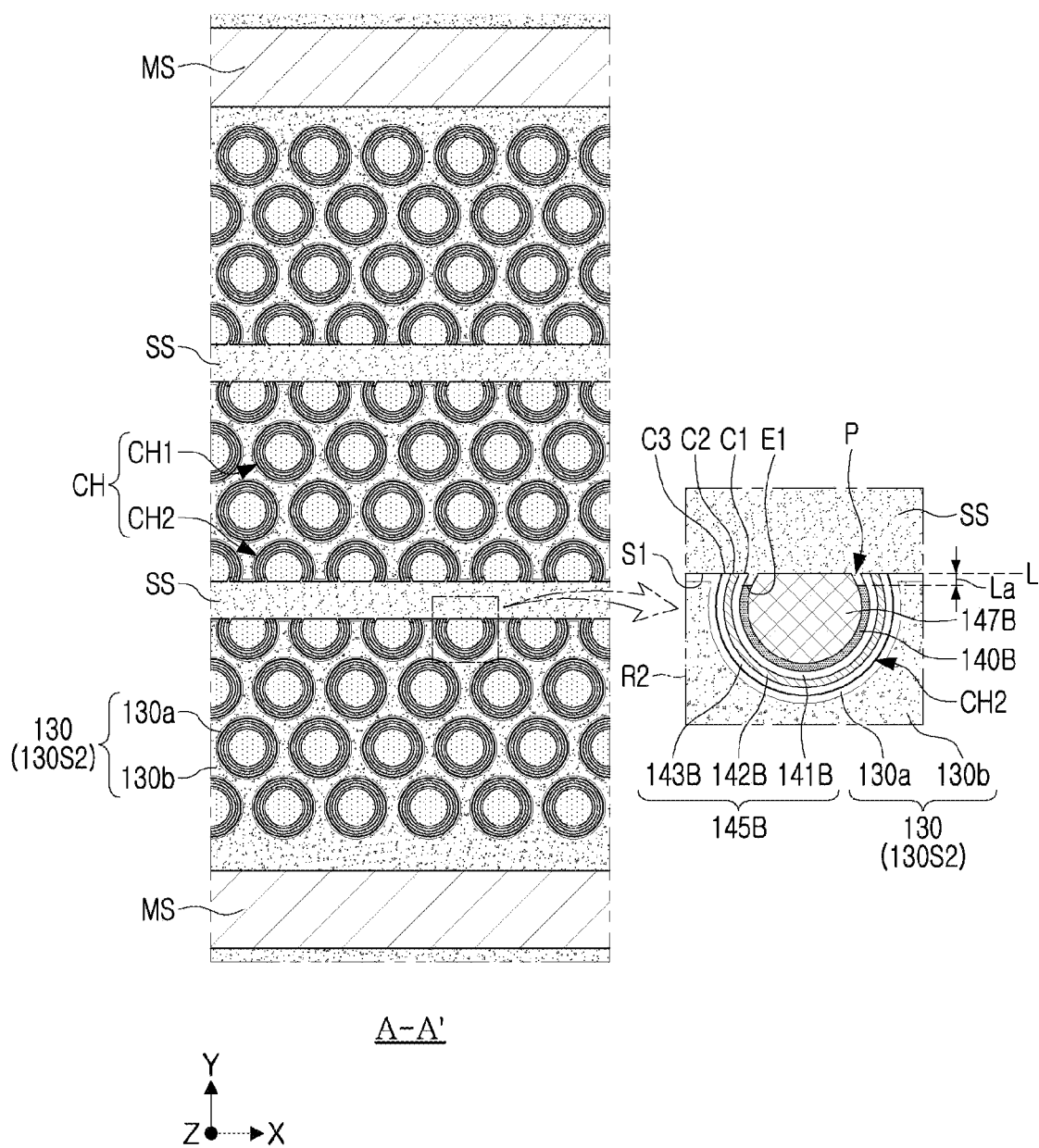
FIG. 8 is a schematic plan view of a semiconductor device according to example embodiments.

FIG. 8 is a schematic plan view of a semiconductor device according to example embodiments. FIG. 8 illustrates a region corresponding to FIG. 3.

Referring to FIG. 8, in a semiconductor device 100d, arrangement of first separation patterns MS, second separation patterns SS, and channel structures CH may be different from that of the previous embodiments. A pair of second separation patterns SS may be disposed between a pair of adjacent first separation patterns MS. The number of channel structures CH disposed between the pair of adjacent first separation patterns MS may be greater than that of the previous embodiments, and second channel structures CH2 having an upper region contacting the second separation patterns SS may be more disposed. Such planar arrangement may be variously changed according to embodiments. In each of the embodiments, since the second channel structure CH2 contacting the second separation pattern SS and having a second channel layer 140B having a recess region or an end portion E1 is used as a channel structure of actual memory cells, not a dummy channel structure, a degree of integration of a semiconductor device may be improved. As described above with reference to FIGS. 7A and 7B, it is possible to prevent a decrease in threshold voltage of the string select transistor provided by the upper gate electrode by the recess region E1 of the second channel layer 140B. Therefore, a semiconductor device having improved electrical characteristics and reliability may be provided.

Figure 9:
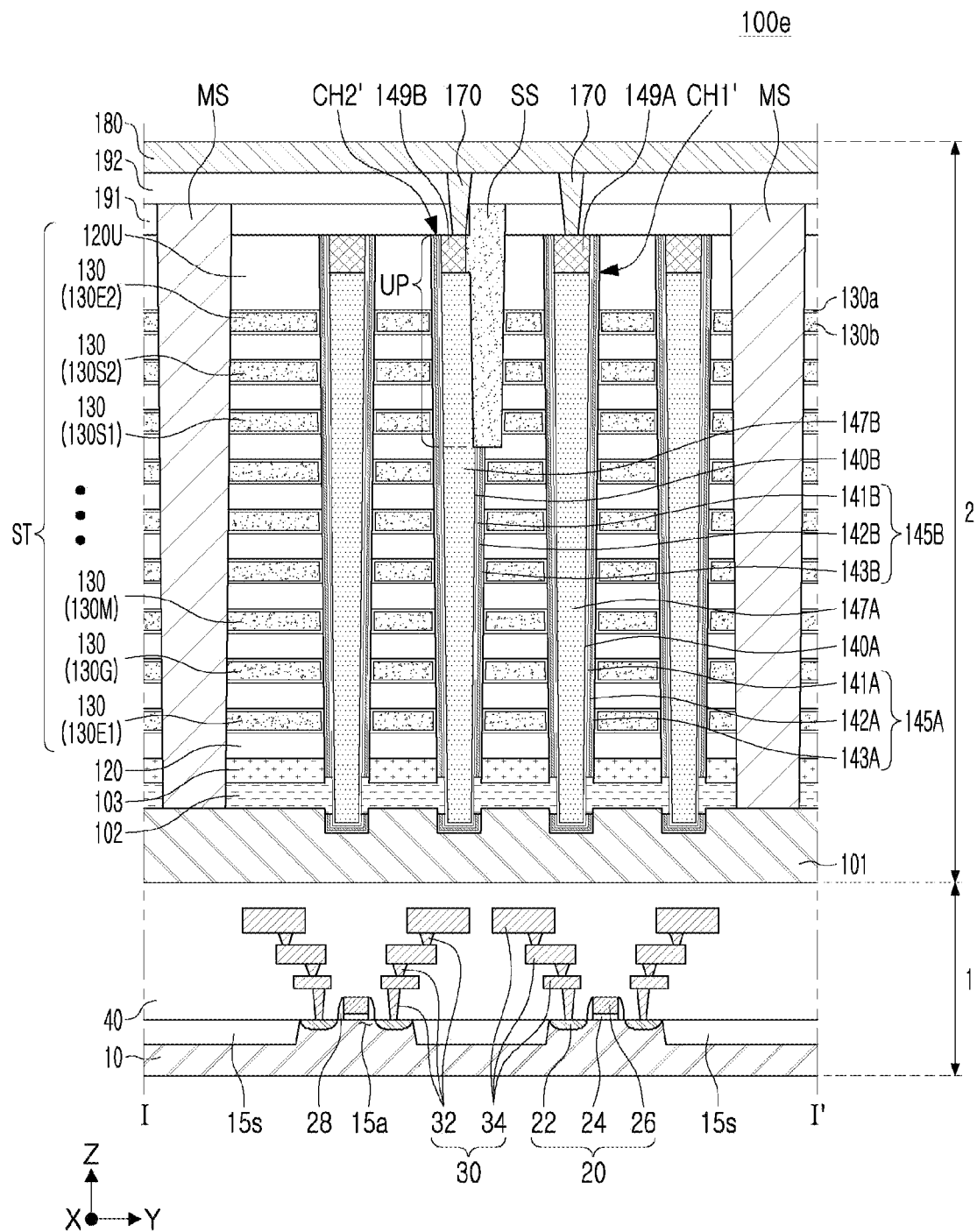
FIG. 9 is a schematic cross-sectional view of a semiconductor device according to example embodiments.

FIG. 9 is a schematic cross-sectional view of a semiconductor device according to example embodiments. FIG. 9 illustrates a region corresponding to FIG. 2.

Referring to FIG. 9, in a semiconductor device 100e, a first pattern layer 102 and a second pattern layer 103, in which a second structure 2 is disposed between an upper substrate 101 and a stack structure ST, may be further included. Channel structures CH1' and CH2' may not include epitaxial layers 107A and 107B, and may pass through the first pattern layer 102 and the second pattern layer 103 in the Z direction. Channel layers 140A and 140B may be in contact with the first pattern layer 102 passing through the gate dielectric layers 145A and 145B. The first pattern layer 102 may function as a portion of a common source line of the semiconductor device 100d, and may function, for example, as a common source line, together with the upper substrate 101. The first pattern layer 102 and the second pattern layer 103 may include or may be formed of a semiconductor material, for example, polycrystalline silicon. In this case, at least, the first pattern layer 102 may be a layer doped with impurities of the same conductivity type as that of the upper substrate 101, and the second pattern layer 103 may be a doped layer or may be a layer containing impurities diffused from the first pattern layer 102. The material of the second pattern layer 103 is not limited to a semiconductor material, and may be replaced with an insulating layer.

In the present embodiment, gate electrodes 130 may further include a first erase control gate electrode 130E1 disposed below a lower gate electrode 130G and a second erase control gate electrode 130E2 disposed on upper gate electrodes 130S1 and 130S2. The first and second erase control gate electrodes 130E1 and 130E2 may form lower and upper erase transistors used for an erase operation using a gate induced drain leakage (GIDL) phenomenon. The number of the gate electrodes 130 constituting each of the lower and upper erase transistors may be one or two or more. A second separation pattern SS may pass through the second erase control gate electrode 130E2 and the upper gate electrodes 130S1 and 130S2 in the Z direction.

Figure 10:
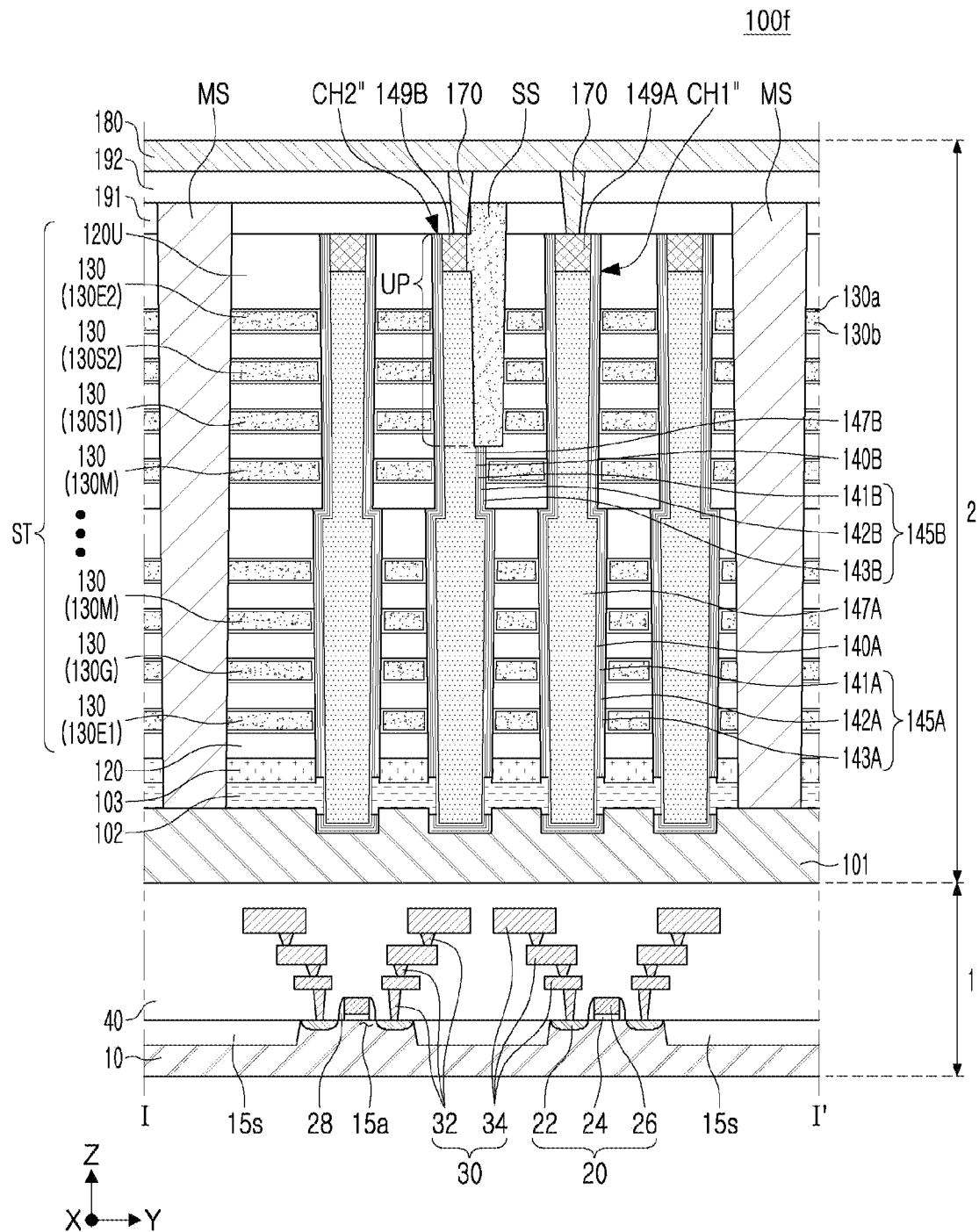
FIG. 10 is a schematic cross-sectional view of a semiconductor device according to example embodiments.

FIG. 10 is a schematic cross-sectional view of a semiconductor device according to example embodiments. FIG. 10 illustrates a region corresponding to FIG. 2.

Referring to FIG. 10, in a semiconductor device 100f, a stack structure ST of a second structure 2 may include a lower stack structure and an upper stack structure on the lower stack structure, and each of first and second channel structures CH1" and CH2" may include a lower channel structure passing through the lower stack structure and an upper channel structure passing through the upper stack structure. Each of the first and second channel structures CH1" and CH2" may have a shape in which the lower channel structure and the upper channel structure are connected with each other, and may have a bend portion due to a difference in width in a connection region. In the connection region, gate dielectric layers 145A and 145B and channel layers 140A and 140B may be bent in the first and second channel structures CH1" and CH2", respectively. The present embodiment illustrates a case in which the stack structure is a double stack structure, and the present inventive concept may also include an embodiment of a multi-stack structure that may be a double or more stack structure.

Figure 11:
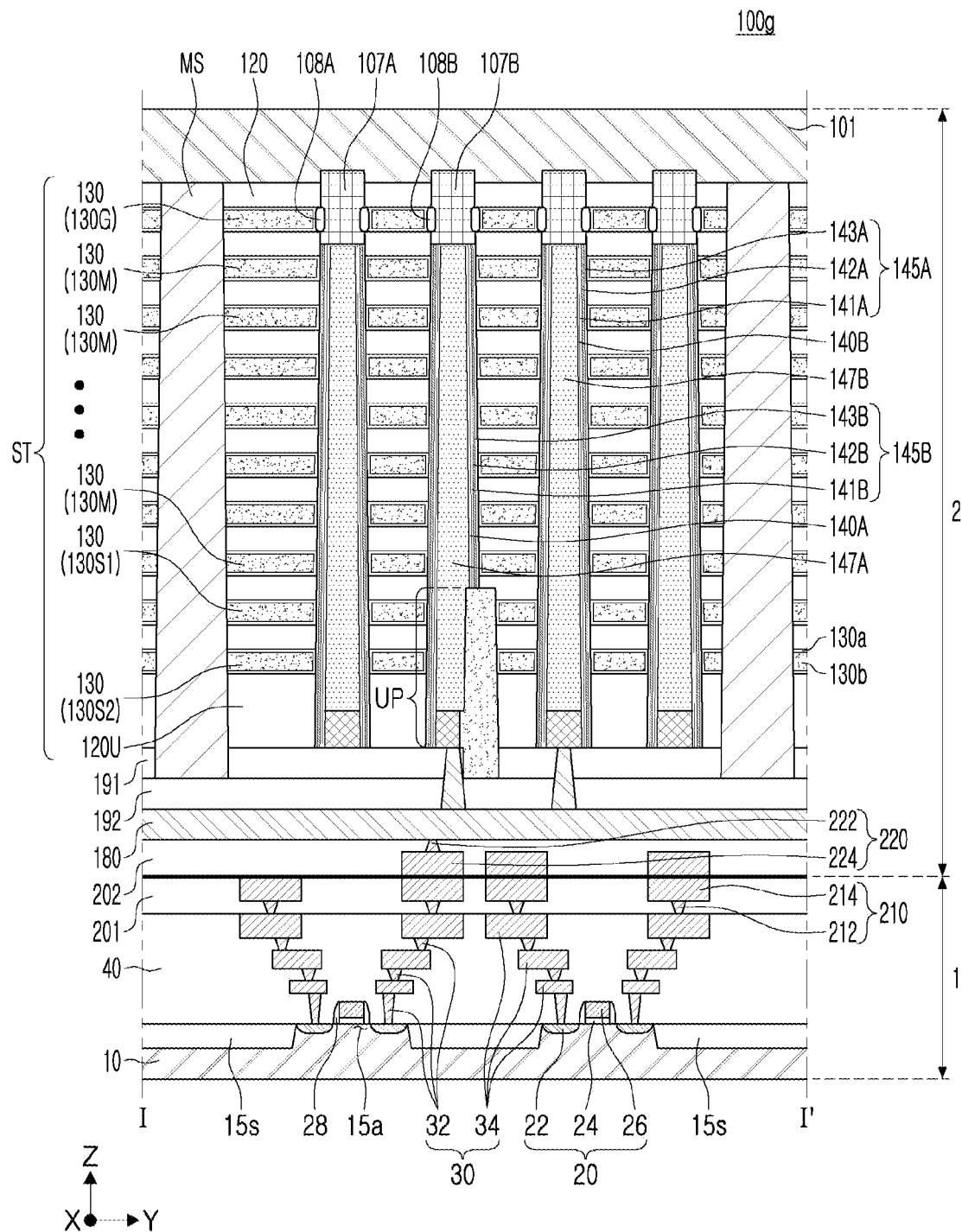
FIG. 11 is a schematic cross-sectional view of a semiconductor device according to example embodiments.

FIG. 11 is a schematic cross-sectional view of a semiconductor device according to example embodiments. FIG. 11 illustrates a region corresponding to FIG. 2.

Referring to FIG. 11, in a semiconductor device 100g, a first structure 1 and a second structure 2 may be bonded with each other by a bonding structure. The second structure 2 of the semiconductor device 100g is illustrated by inverting (i.e., placing upside down) the second structure 2 of the semiconductor device 100 of FIG. 1, and may further include an upper bonding structure 220, and an upper bonding insulating layer 202 in which the upper bonding structure 220 is disposed. The first structure 1 may further include a lower bonding structure 210 bonded to the upper bonding structure 220, and a lower bonding insulating layer 201 in which the lower bonding structure 210 is disposed.

The lower bonding structure 210 may include a lower bonding via 212 and a lower bonding pad 214, electrically connected to a lower wiring structure 30. The upper bonding structure 220 may include an upper bonding via 222 and an upper bonding pad 224, electrically connected to bit lines 180. The lower bonding structure 210 and the upper bonding structure 220 may include or may be formed of, for example, tungsten (W), aluminum (Al), copper (Cu), tungsten nitride (WN), tantalum nitride (TaN), titanium nitride (TiN), or an alloy thereof. The lower bonding pad 214 and the upper bonding pad 224 may function as bonding layers for bonding the first structure 1 and the second structure 2 with each other. In addition, the lower bonding pad 214 and the upper bonding pad 224 may provide an electrical connection path between the first structure 1 and the second structure 2. The lower bonding pad 214 and the upper bonding pad 224 may be bonded by copper (Cu)-copper (Cu) bonding.

Figure 12:
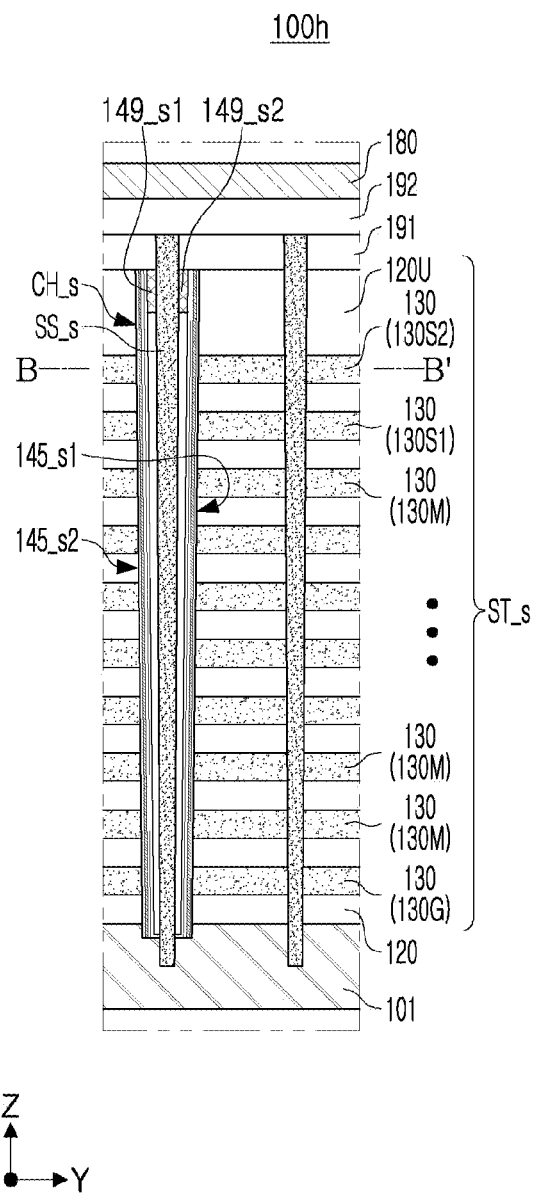
FIG. 12 is a schematic cross-sectional view of a semiconductor device according to example embodiments.

FIG. 12 is a schematic cross-sectional view of a semiconductor device according to example embodiments.

Figure 13:
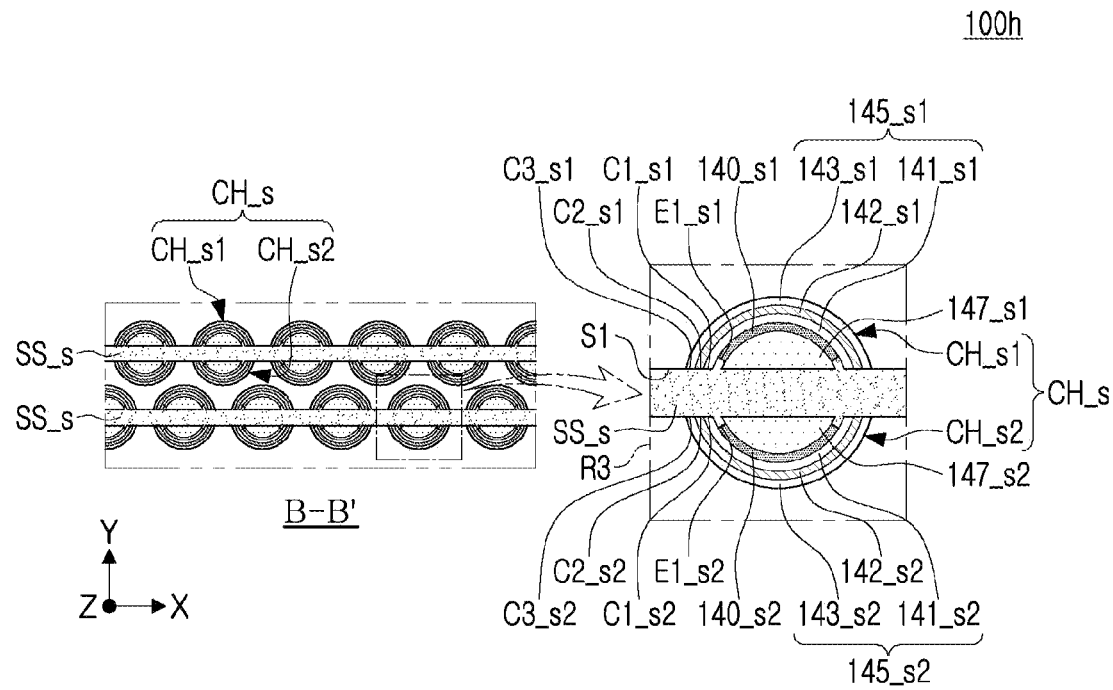
FIG. 13 is a schematic horizontal cross-sectional view of a semiconductor device according to example embodiments.

FIG. 13 is a schematic horizontal cross-sectional view of a semiconductor device according to example embodiments.

FIG. 13 illustrates a cross-sectional view of the semiconductor device on a level corresponding to line B-B' in FIG. 12, in a plan view.

Referring to FIGS. 12 and 13, in a semiconductor device 100h, a stack structure ST_s may be disposed on the same first structure 1 as described with reference to FIGS. 1 to 3, and may include channel structures CH_s and separation patterns SS_s passing through the stack structure ST_s. In a plan view, each of the separation patterns SS_s may have a linear shape (i.e., a straight line shape) extending in the X direction.

The channel structure CH_s may include a first separation channel structure CH_s1 and a second separation channel structure CH_s2, separated by a separation pattern SS_s. As illustrated in an enlarged region R3 of FIG. 13, in a plan view, the first separation channel structure CH_s1 and the second separation channel structure CH_s2 may have a mirror-symmetric structure with the separation pattern SS_s interposed therebetween. In a plan view, each of the first separation channel structure CH_s1 and the second separation channel structure CH_s2 may have a hemispherical shape.

The channel structures CH_s and the separation patterns SS_s, arranged in the X direction, may separate the stack structure ST_s in the Y direction. In the channel structure CH_s, a channel layer 140_s may include a first separation channel layer 140_s1 and a second separation channel layer 140_s2 that may be completely separated by the separation pattern SS_s in the Y direction. A core insulating layer 147_s may include a first separation core insulating layer 147_s1 and a second separation core insulating layer 147_s2 that may be completely separated by the separation pattern SS_s in the Y direction. A gate dielectric layer 145_s may include a first separation gate dielectric layer 145_s1 and a second separation gate dielectric layer 145_s2 that may be completely separated by the separation pattern SS_s in the Y direction.

In a plan view, the first separation channel layer 140_s1 and the first separation gate dielectric layer 145_s1 may have a bar shape convexly curved in a direction from the first separation core insulating layer 147_s1 toward the first separation gate dielectric layer 145_s1. In a plan view, the second separation channel layer 140_s2 and the second separation gate dielectric layer 145_s2 may have a bar shape convexly curved in a direction from the second separation core insulating layer 147_s2 toward the second separation gate dielectric layer 145_s2. For example, the first separation channel layer 140_s1 and the second separation channel layer 140_s2 may have a convex bow shape in opposite directions, and a first separation data storage layer 142_s1 and a second separation data storage layer 142_s2 may have a convex bow shape in opposite directions.

In the first separation channel structure CH_s1, recess regions or end portions E1_s1 of the first separation channel layer 140_s1 may be recessed in a direction away from an outer side of the separation pattern SS_s, compared to at least one of end portions C1_s1, C2_s1, and C3_s1 of the first separation gate dielectric layer 145_s1, in a plan view. In the second separation channel structure CH_s2, recess regions or end portions E1_s2 of the second separation channel layer 140_s2 may be recessed in a direction away from an outer side of the separation pattern SS_s, compared to at least one of end portions C1_s2, C2_s2, and C3_s2 of the second separation gate dielectric layer 145_s2, in a plan view.

Figure 14:
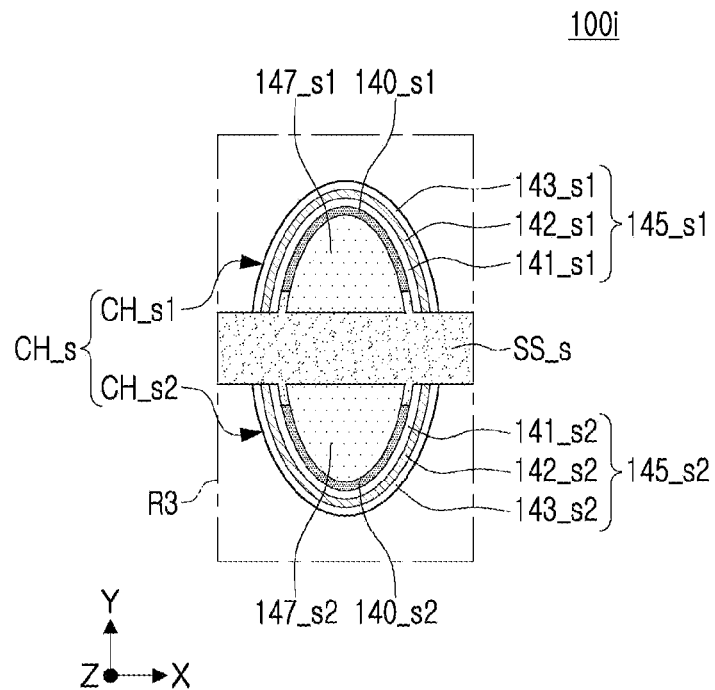
FIG. 14 is a partially enlarged horizontal cross-sectional view of a semiconductor device according to example embodiments.

FIG. 14 is a partially enlarged horizontal cross-sectional view of a semiconductor device according to example embodiments. FIG. 14 illustrates a region corresponding to region R3 of FIG. 13.

Referring to FIG. 14, in a semiconductor device 100i, a first separation channel structure CH_s1 and a second separation channel structures CH_s2 may be arranged in a mirror-symmetric manner with respect to a separation pattern SS_s. The first separation channel structure CH_s1 may include a first separation gate dielectric layer 145_s1, a first separation channel layer 140_s1, and a first separation core insulating layer 147_s1. The second separation channel structure CH_s2 may include a second separation gate dielectric layer 145_s2, a second separation channel layer 140_s2, and a second separation core insulating layer 147_s2. In a plan view, each of the first separation channel structure CH_s1 and the second separation channel structure CH_s2 may have a hemispherical shape elongated in the Y direction. The first separation channel layer 140_s1 and the second separation channel layer 140_s2 may include end portions recessed in a direction away from an outer side of the separation pattern SS_s.

Figure 15:
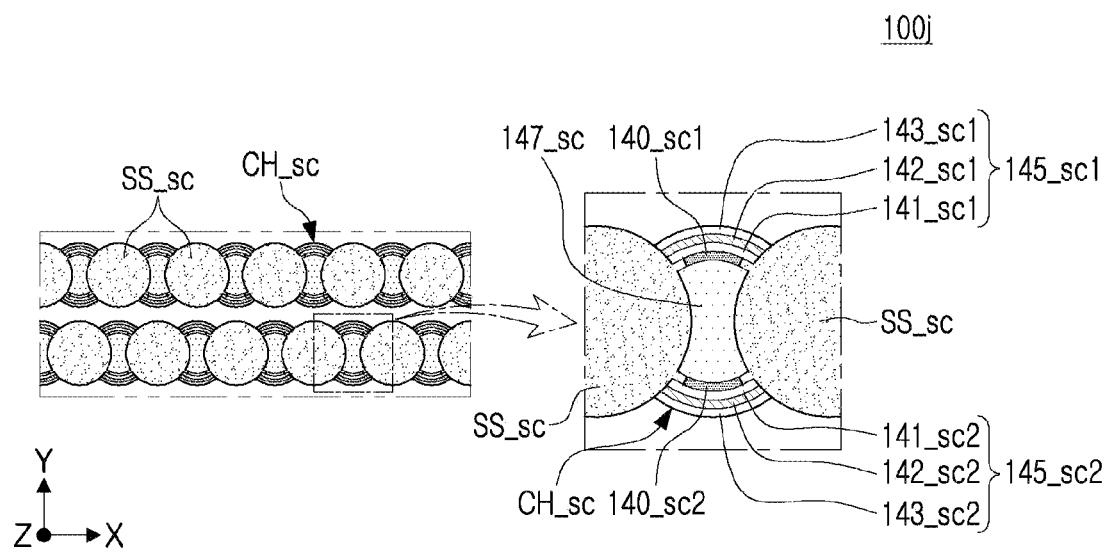
FIG. 15 is a schematic horizontal cross-sectional view of a semiconductor device according to example embodiments.

FIG. 15 is a schematic horizontal cross-sectional view of a semiconductor device according to example embodiments. FIG. 15 illustrates a region corresponding to FIG. 13.

Referring to FIG. 15, in a semiconductor device 100j, separation patterns SS_sc may have a circular shape in a plan view, may be in contact with channel structures CH_sc, and may be repeatedly alternated with the channel structures CH_sc in the X direction. One separation pattern, among the separation patterns SS_sc, may be disposed to contact two channel structures CH_sc, adjacent to each other in the X direction. One channel structure, among the channel structures CH_sc, may be disposed to contact two separation patterns SS_sc, adjacent to each other in the X direction. Therefore, as illustrated in an enlarged region R4 of FIG. 15, in the one channel structure CH_sc, a channel layer 140_sc may include a first separation channel layer 140_sc1 and a second separation channel layer 140_sc2, completely separated by two separation patterns SS_sc in the Y direction, and a gate dielectric layer 145_sc may include a first separation gate dielectric layer 145_sc1 and a second separation gate dielectric layer 145_s2, completely separated by two separation patterns SS_sc in the Y direction. In the one channel structure CH_sc, a core insulating layer 147_sc may not be separated by the separation patterns SS_sc. Each of the first separation channel layer 140_sc1 and the second separation channel layer 140_sc2 may include an inwardly recessed region, in a plan view.

FIGS. 16 to 22 are schematic views illustrating a method of manufacturing a semiconductor device according to example embodiments. FIGS. 16, 17, 18B, 19B, 20B, 21B, and 22 may be cross-sectional views according to a process sequence of a region corresponding to line I-I' of FIG. 1, FIGS. 18A, 19A, 20A, and 21A may be plan views according to a process sequence of a region corresponding to FIG. 1, and FIGS. 18C, 19C, 20C, and 21C may be horizontal cross-sectional views according to a process sequence of a region corresponding to FIG. 3.

Figure 16:
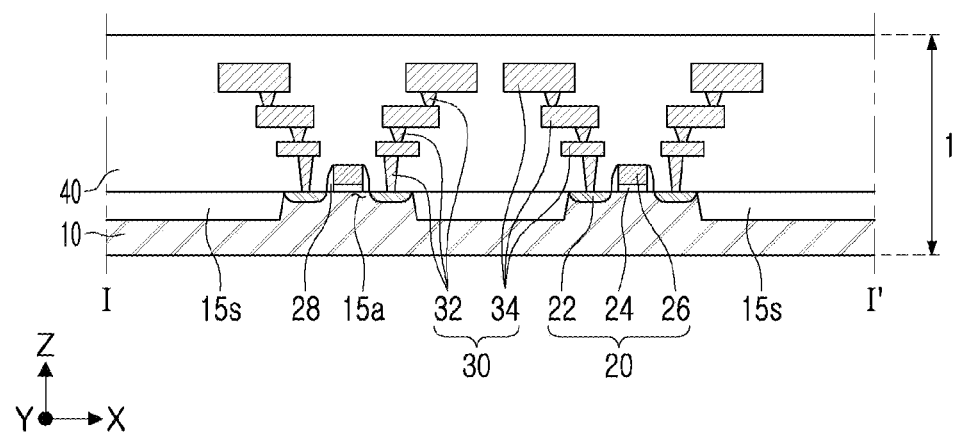
FIGS. 16, 17, 18A to 18C, 19A to 19C, 20A to 20C, 21A to 21C, and 22 are schematic views illustrating a method of manufacturing a semiconductor device according to example embodiments.

Referring to FIG. 16, a first structure 1 including circuit elements 20 and a lower wiring structure 30 may be formed on a lower substrate 10.

First, device isolation layers 15s may be formed in the lower substrate 10, and a circuit gate dielectric layer 24 and a circuit gate electrode 26 may be sequentially formed on an active region 15a. The device isolation layers 15s may be formed by, for example, a shallow trench isolation (STI) process. The circuit gate dielectric layer 24 may be formed of silicon oxide, and the circuit gate electrode 26 may include or may be formed of at least one of a polycrystalline silicon layer and a metal silicide layer, but is not limited thereto. Next, a spacer layer 28 may be formed on opposite sidewalls of the circuit gate dielectric layer 24 and opposite sidewalls of the circuit gate electrode 26, and source/drain regions 22 may be formed in the active region 15a. In some embodiments, the spacer layer 28 may be formed of a plurality of layers. The source/drain regions 22 may be formed by performing an ion implantation process.

Lower contacts 32 and lower wirings 34 of the lower wiring structure 30 may be formed by partially forming a lower capping insulating layer 40, etching and removing a portion thereof, and filling a conductive material therein, or may be formed by depositing a conductive material, patterning the same, and filling a portion removed by the patterning with a portion of a lower capping insulating layer 40.

The lower capping insulating layer 40 may be formed of a plurality of insulating layers. The lower capping insulating layer 40 may be partially formed in each operation of forming the lower wiring structure 30, and may be further partially formed on an uppermost lower wiring 34, to be finally prepared to cover the circuit elements 20 and the lower wiring structure 30.

Figure 17:
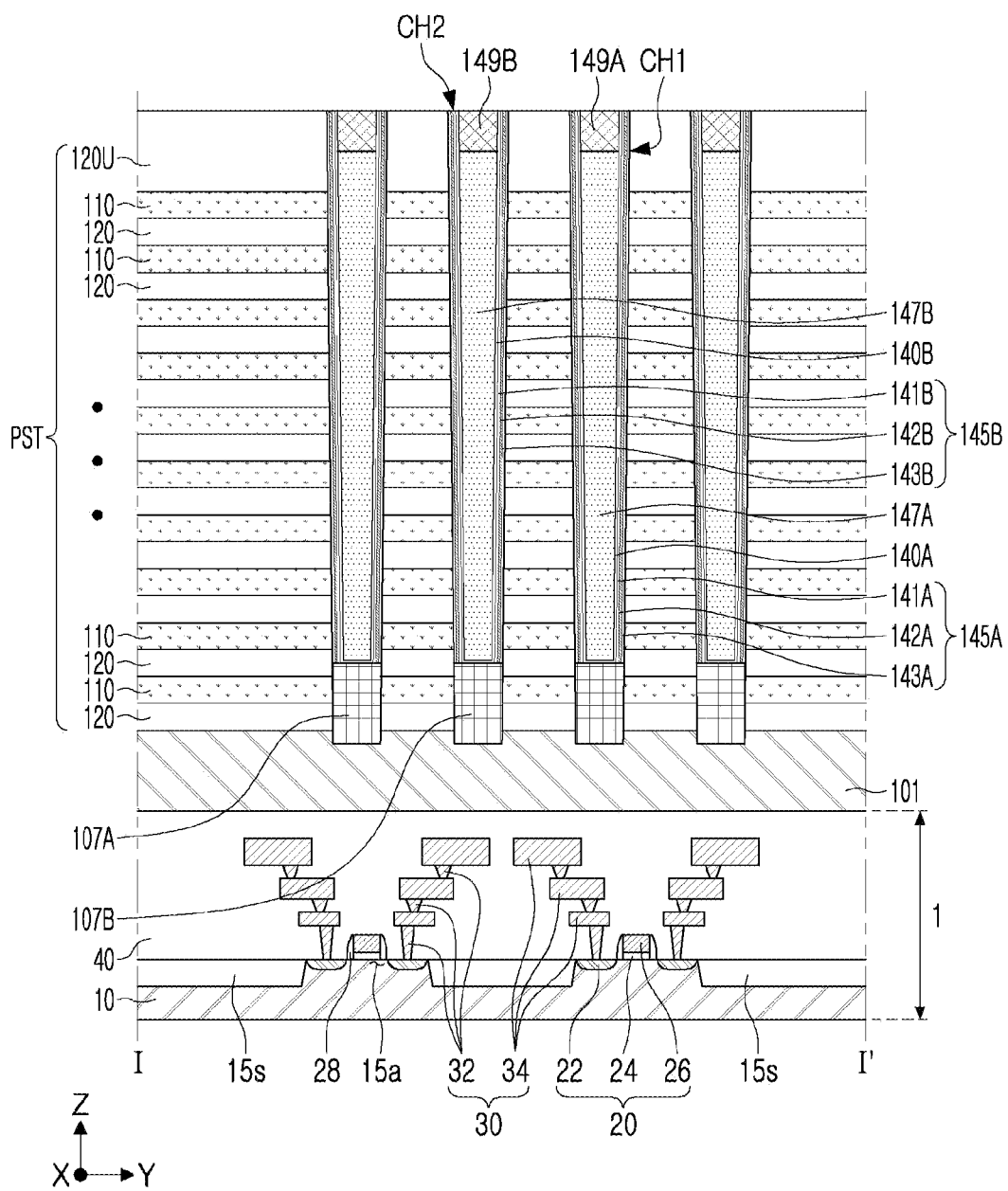

Referring to FIG. 17, an upper substrate 101 may be formed on the first structure 1, and sacrificial insulating layers 110 and interlayer insulating layers 120 may be alternately stacked on the upper substrate 101, and channel structures CH1 and CH2 passing through a stack structure of the sacrificial insulating layers 110 and the interlayer insulating layers 120 may be formed.

The upper substrate 101 may be formed of, for example, polycrystalline silicon. Polycrystalline silicon constituting the upper substrate 101 may include impurities.

The sacrificial insulating layers 110 may be partially replaced by a gate electrodes 130 (refer to FIG. 2) by a subsequent process. The sacrificial insulating layers 110 may be formed of a material, different from that of the interlayer insulating layers 120, and may be formed of a material that may be etched with etching selectivity with respect to the interlayer insulating layers 120 under specific etching conditions. For example, the interlayer insulating layer 120 may be formed of at least one of silicon oxide and silicon nitride, and the sacrificial insulating layers 110 may be formed of a material, different from that of the interlayer insulating layer 120, selected from silicon, silicon oxide, silicon carbide, and silicon nitride. In embodiments, thicknesses of the interlayer insulating layers 120 may not all be the same. Thicknesses of the interlayer insulating layers 120 and the sacrificial insulating layers 110 and the number of layers constituting the interlayer insulating layers 120 and the sacrificial insulating layers 110 may be variously changed, from those illustrated. A preliminary stack structure PST may be formed by stacking the sacrificial insulating layers 110 and the interlayer insulating layers 120.

The channel structures CH1 and CH2 may be formed by anisotropically etching the preliminary stack structure PST of the sacrificial insulating layers 110 and the interlayer insulating layers 120, and may be formed by forming and filling hole-shaped channel holes. For example, epitaxial layers 107A and 107B may be formed in the channel holes from the upper substrate 101 by an epitaxial growth process, gate dielectric layers 145A and 145B conformally covering inner sidewalls and bottom surfaces of the channel holes may be formed, channel layers 140A and 140B may be formed on the gate dielectric layers 145A and 145B in the channel holes, core insulating layers 147A and 147B filling a space between inner walls of the channel layers 140A and 140B in the channel holes may be formed, and channel pads 149A and 149B may be formed in regions from which upper portions of the core insulating layers 147A and 147B are partially removed. Portions of the gate dielectric layers 145A and 145B covering upper surfaces of the epitaxial layers 107A and 107B may be removed, to form the channel layers 140A and 140B to contact the epitaxial layers 107A and 107B. The channel structures CH1 and CH2 may have side surfaces inclined with respect to an upper surface of the lower substrate 10 or an upper surface of the upper substrate 101. The channel structures CH1 and CH2 may be formed to extend into a portion of the upper substrate 101.

Figure 18A:
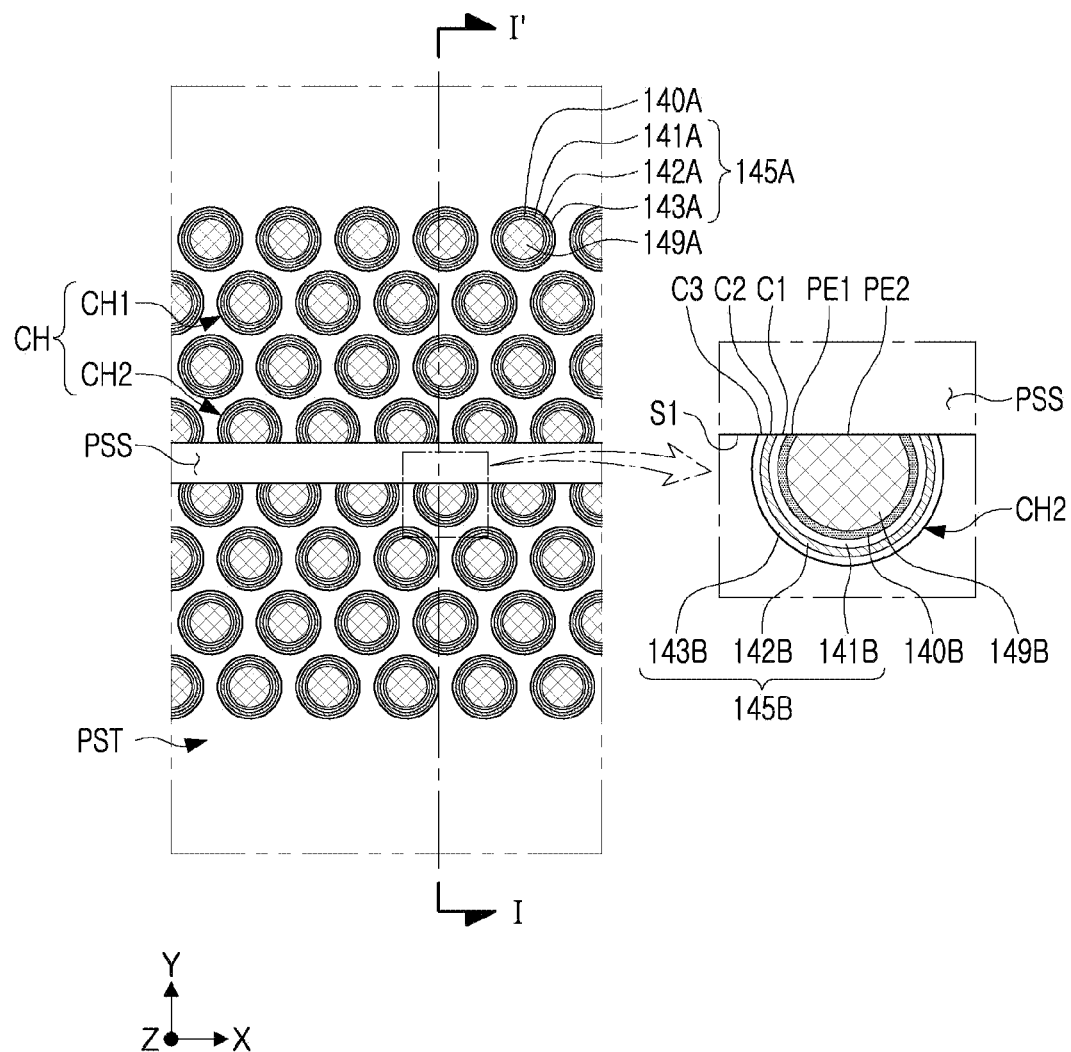
Figure 18B:
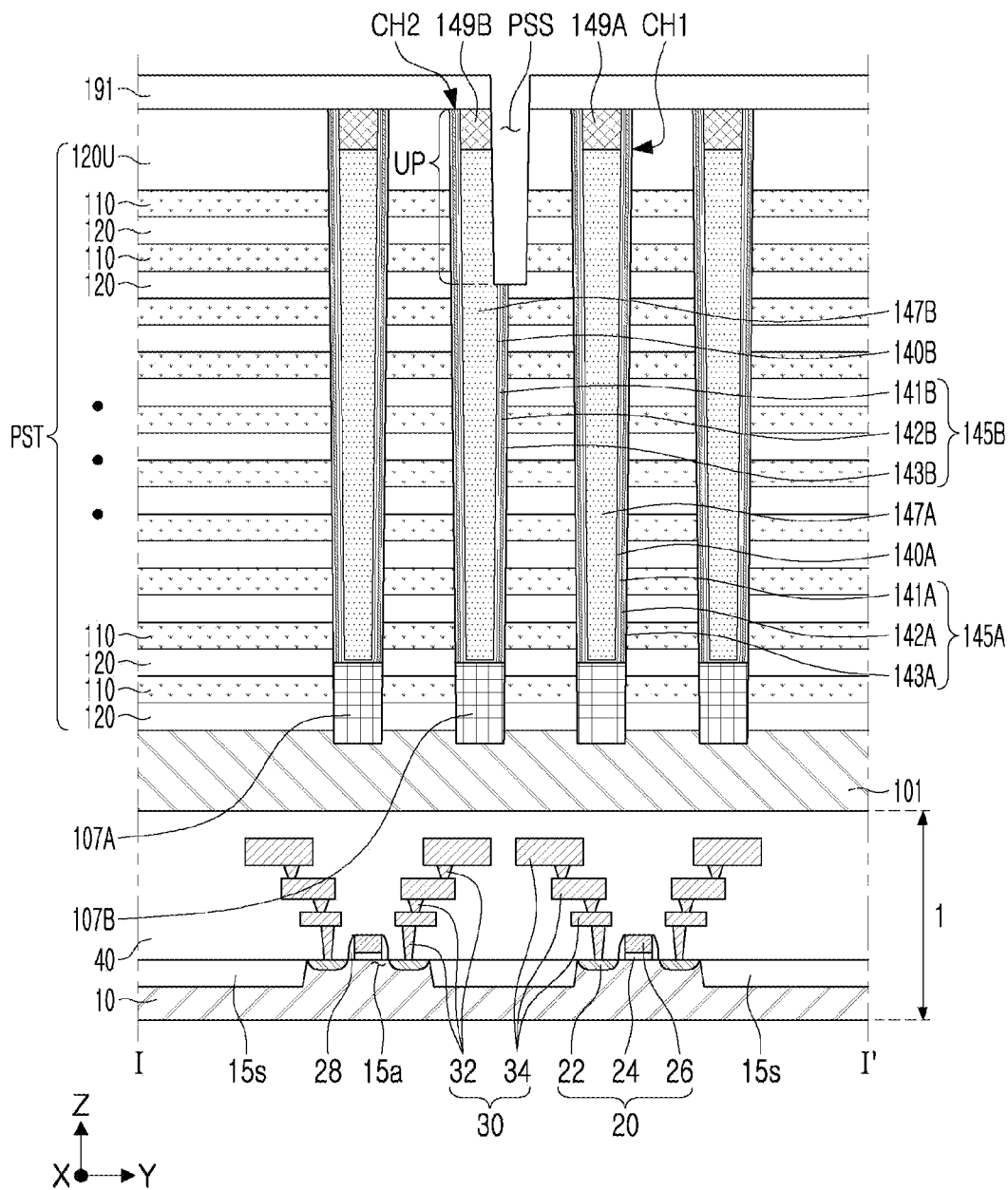
Figure 18C:
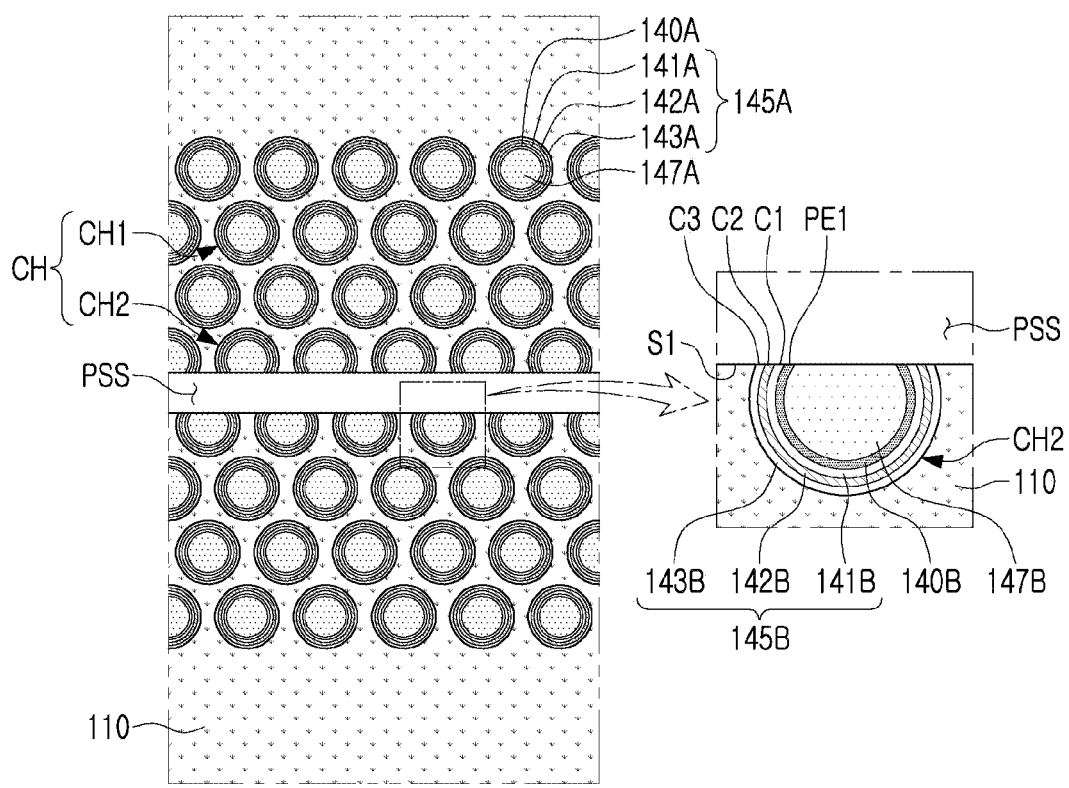

Referring to FIGS. 18A, 18B, and 18C, the sacrificial insulating layers 110 and a portion of the interlayer insulating layers 120 may be removed from an upper portion to form an upper trench PSS.

The upper trench PSS may be prepared by forming a first upper insulating layer 191 on the channel structures CH1 and CH2, and by removing, using a separate mask layer, a predetermined number of the sacrificial insulating layers 110 from an upper portion of the first upper insulating layer 191. The upper trench PSS may not overlap a first channel structure CH1 in the Z direction, and may be spaced apart from the first channel structure CH1. The upper trench PSS may be disposed to partially overlap a second channel structure CH2 in the Z direction, and a portion of the second channel structure CH2 may be cut. Therefore, in an upper region UP of the second channel structure CH2, end portions C1, C2, C3, and PE1 cut by the upper trench PSS and exposed to the upper trench PSS may be formed on a second gate dielectric layer 145B and a second channel layer 140B. In this operation, the end portion PE1 of the second channel layer 140B may be substantially coplanar with the end portions C1, C2, and C3 of the second gate dielectric layer 145B. In the upper region UP of the second channel structure CH2, end portions PE2 cut by the upper trench PSS and exposed to the upper trench PSS may also be formed in a second channel pad 149B.

Figure 19A:
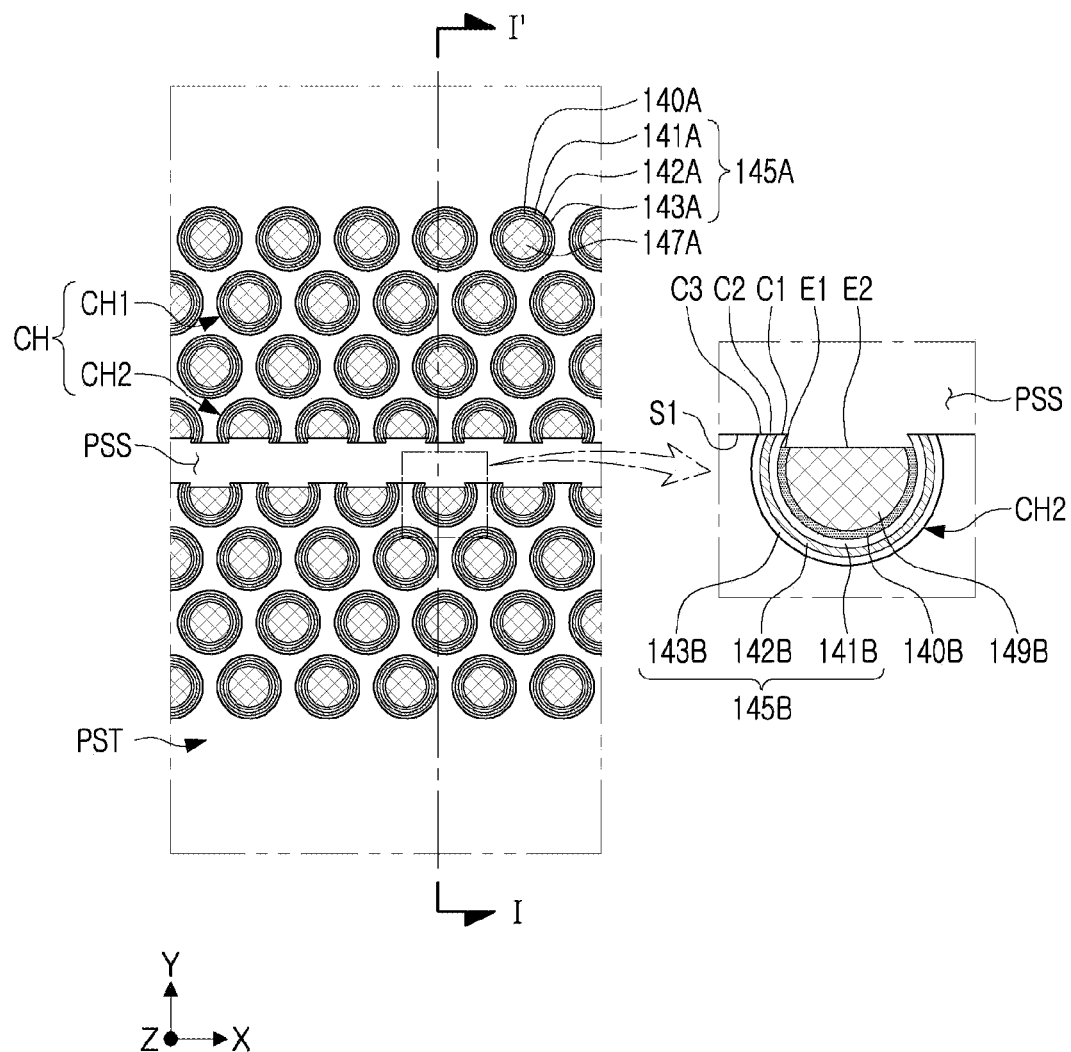
Figure 19B:
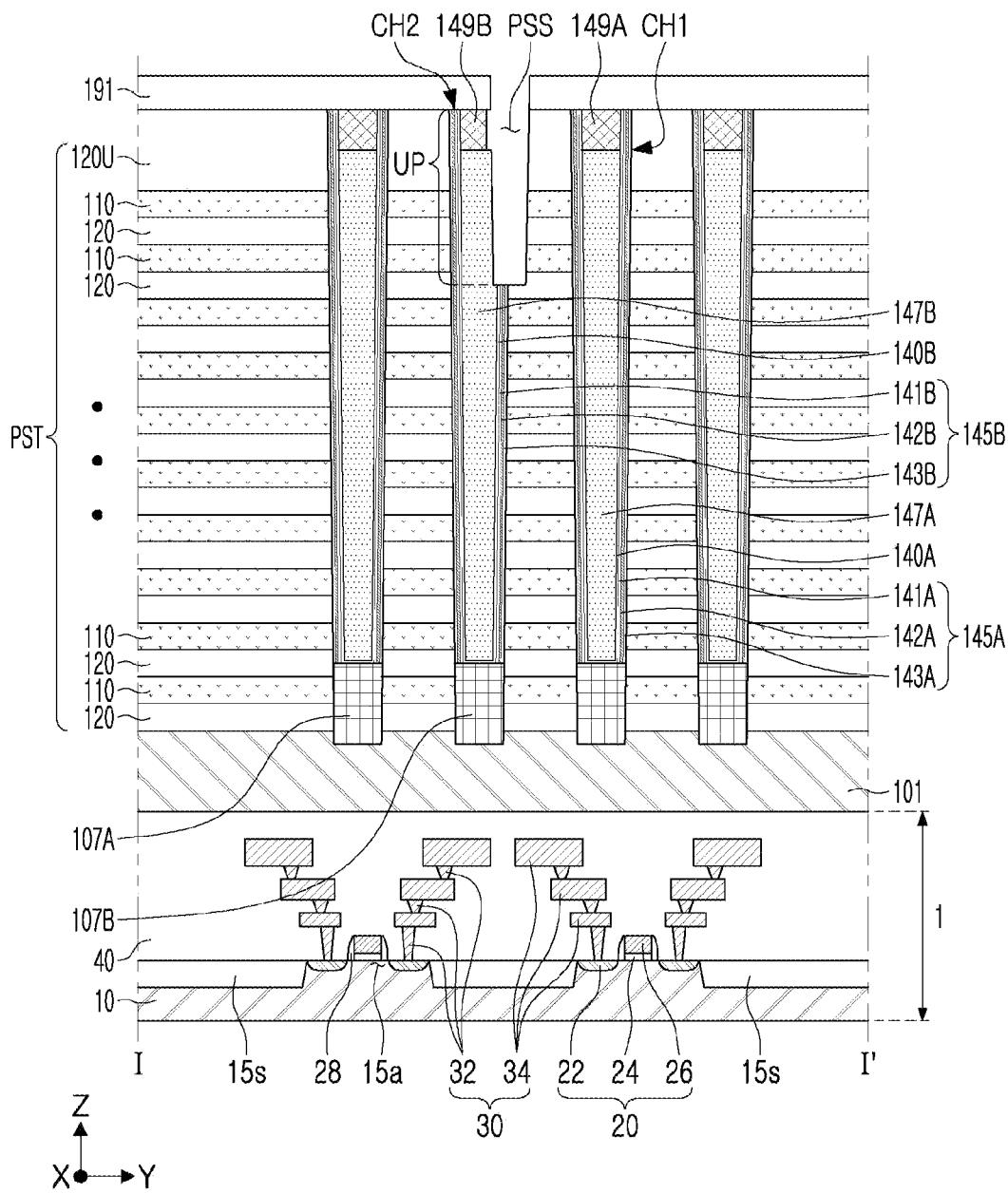
Figure 19C:
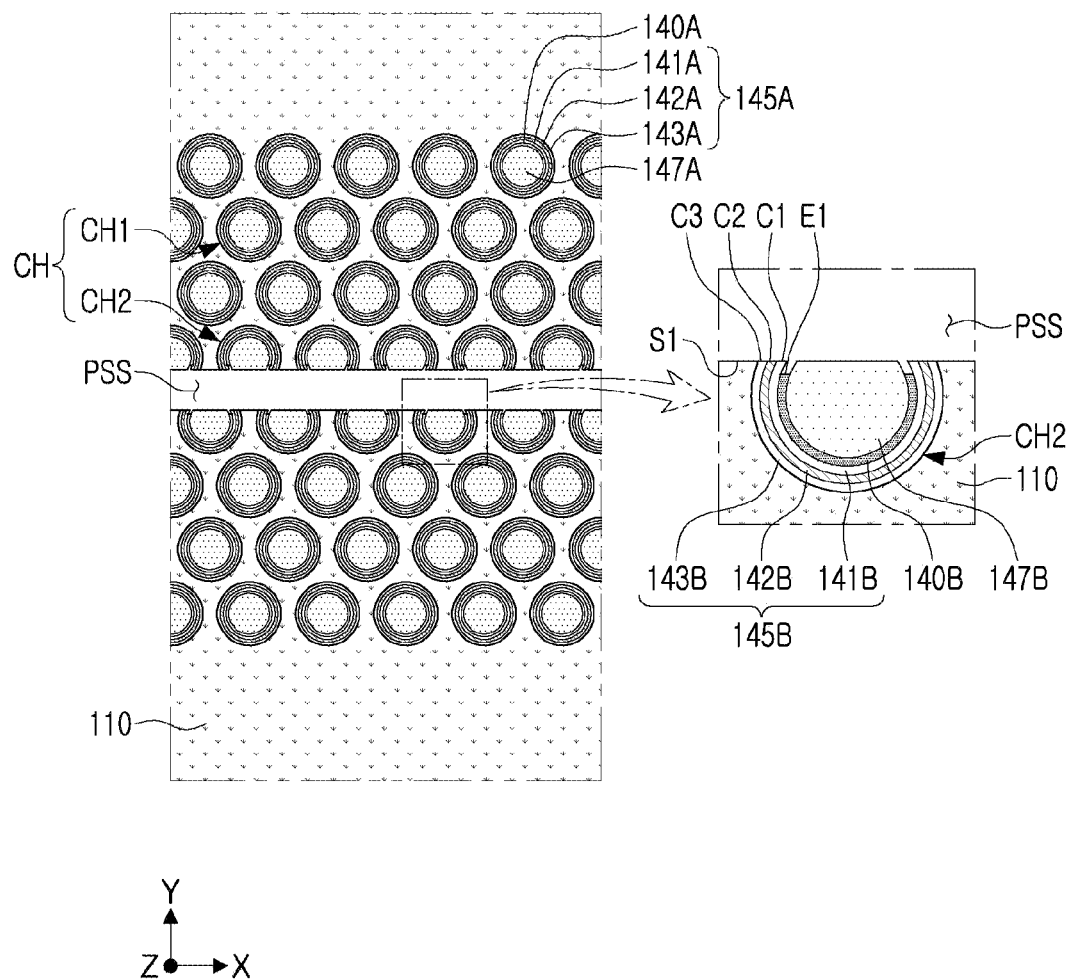

Referring to FIGS. 19A, 19B, and 19C, a portion of the second channel layer 140B and a portion of the second channel pad 149B may be removed through the upper trench PSS.

The second channel layer 140B may be selectively removed with respect to the second gate dielectric layer 145B, the second core insulating layer 147B, the sacrificial insulating layers 110, and the interlayer insulating layers 120. The second channel layer 140B may be removed using, for example, a wet etching process or a dry etching process. A portion of the second channel layer 140B may be removed to form a recess region or an end portion E1 that may be recessed, compared to the end portions C1, C2, and C3 of the second gate dielectric layer 145B. As the second channel layer 140B is partially recessed, the second channel pad 149B may also be partially recessed to form an end portion E2. Recessed lengths of the second channel pad 149B and the second channel layer 140B may be substantially the same or different from each other. In an example embodiment, the second channel layer 140B exposed to the upper trench PSS may not be recessed, and an exposed end portion thereof may also be simultaneously oxidized.

Figure 20A:
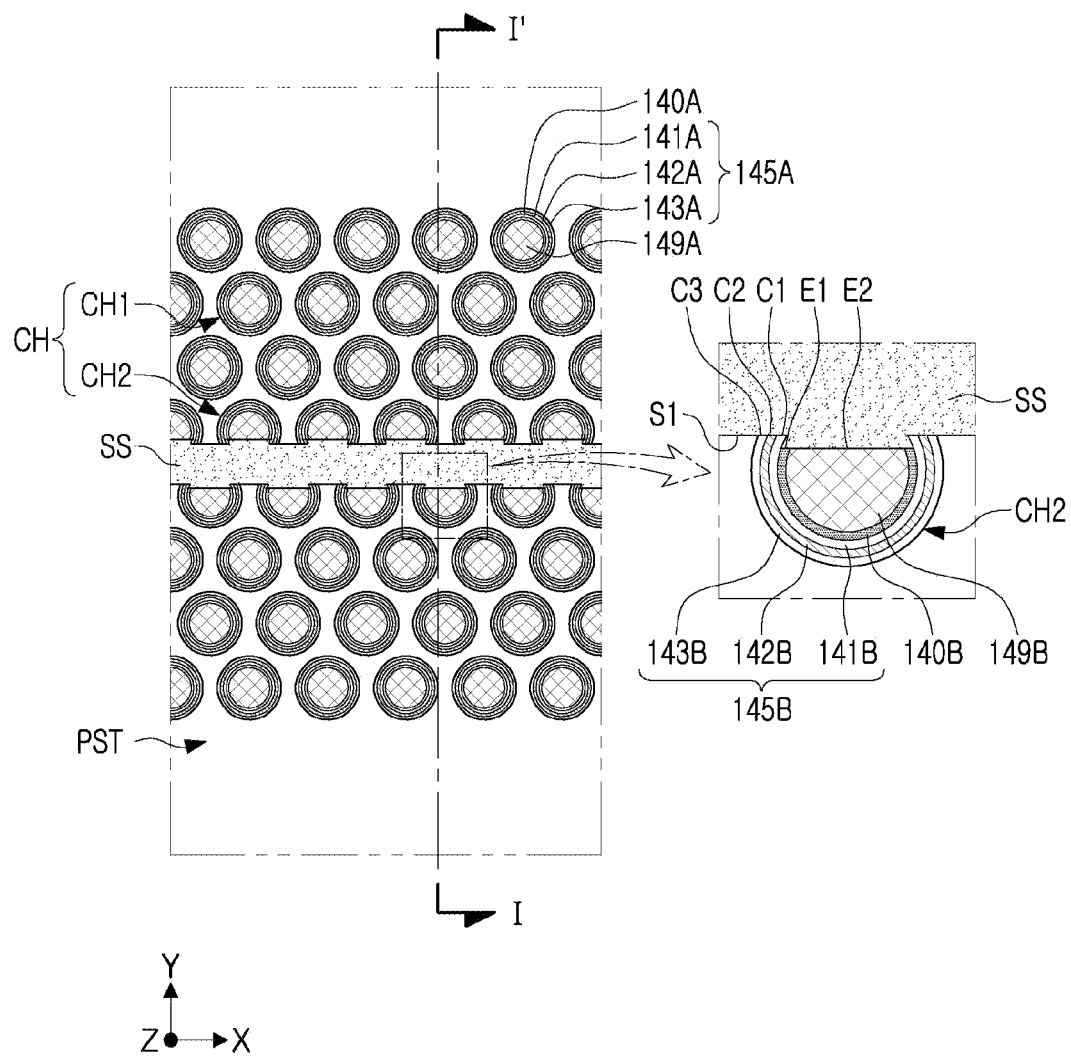
Figure 20B:
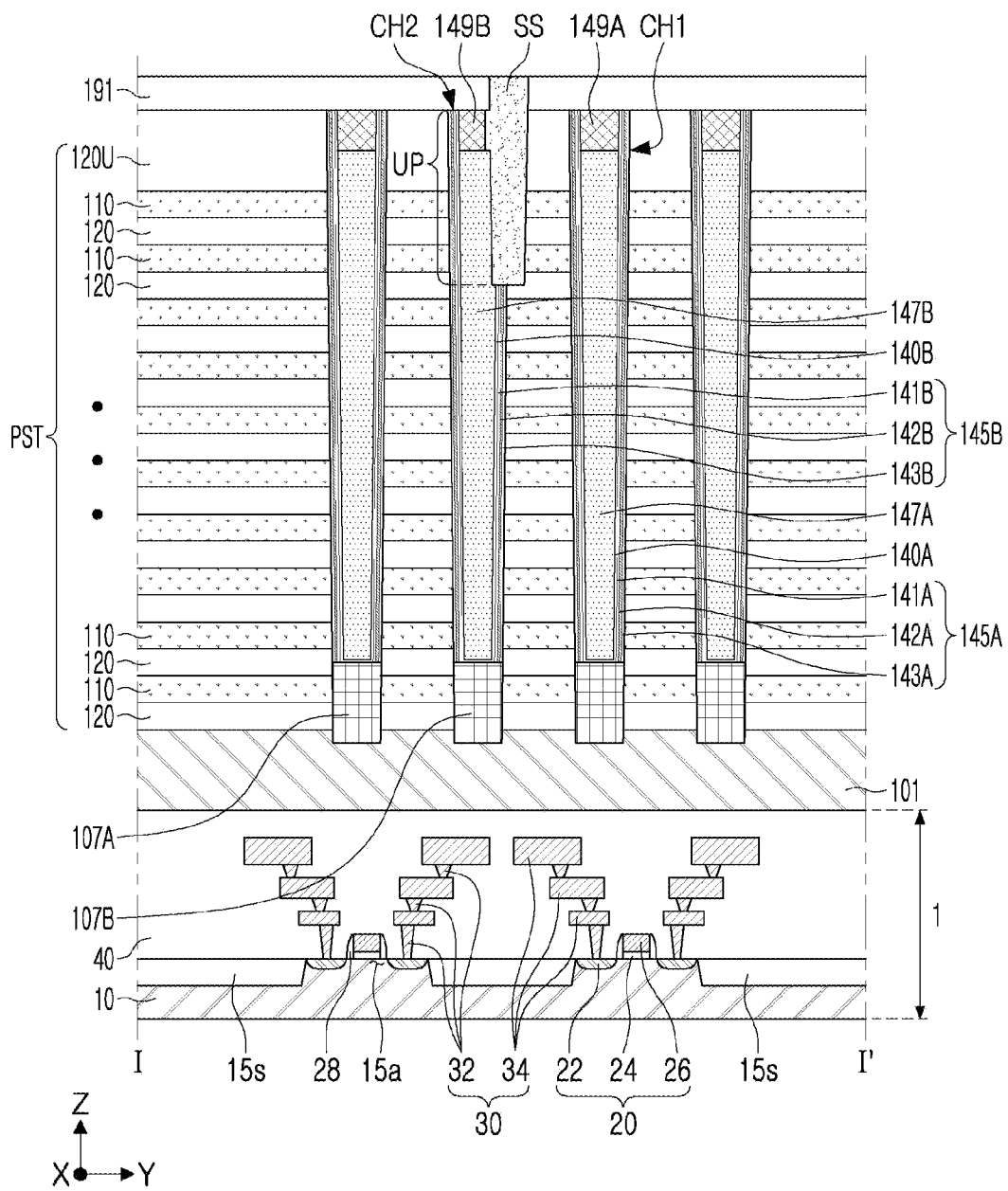
Figure 20C:
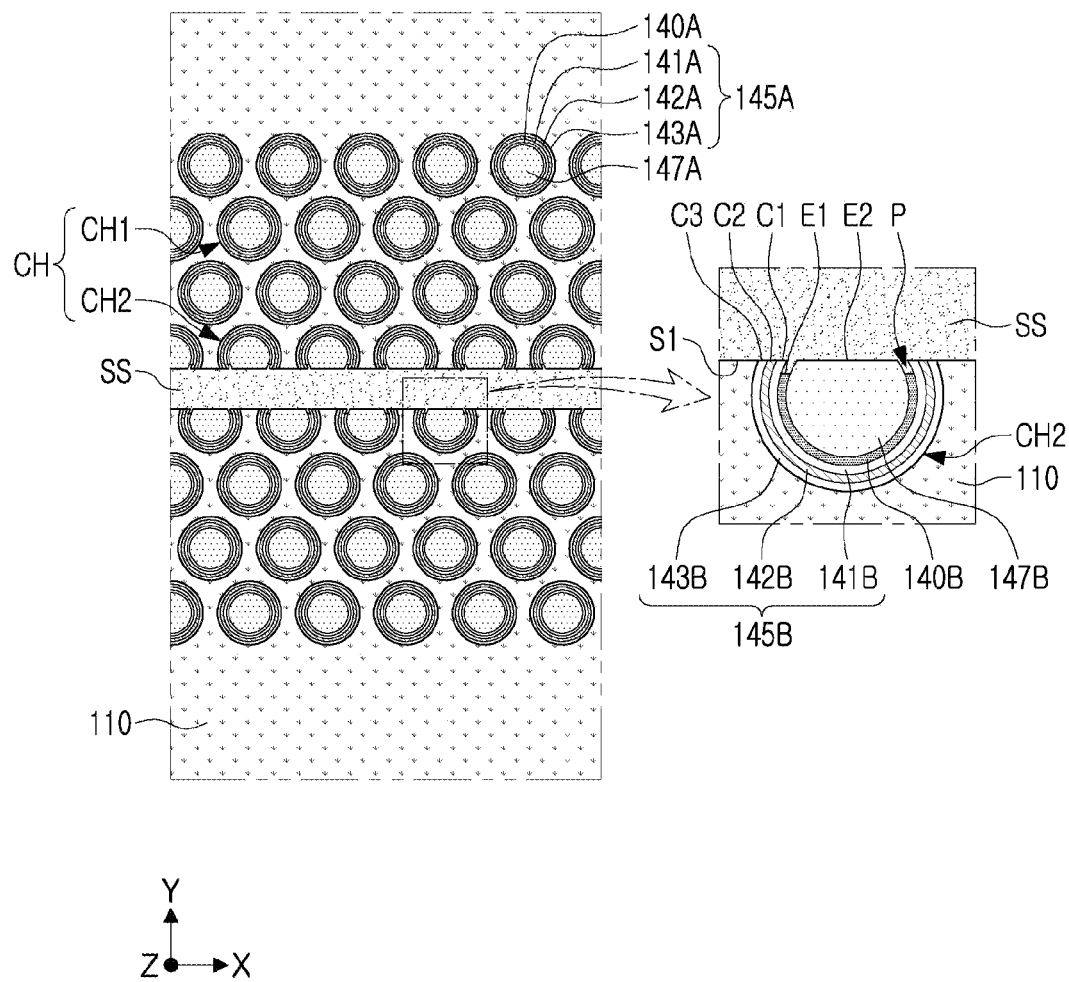

Referring to FIGS. 20A, 20B, and 20C, a second separation pattern SS may be prepared by forming an insulating material layer in the upper trench PSS.

The second separation pattern SS may be formed by filling the upper trench PSS with an insulating material layer such as silicon oxide. The insulating material layer may be formed between the second gate dielectric layer 145B and the second core insulating layer 147B to form a protrusion P of the second separation pattern SS. The protrusion P may be in contact with the recessed end portion E1 of the second channel layer 140B.

Figure 21A:
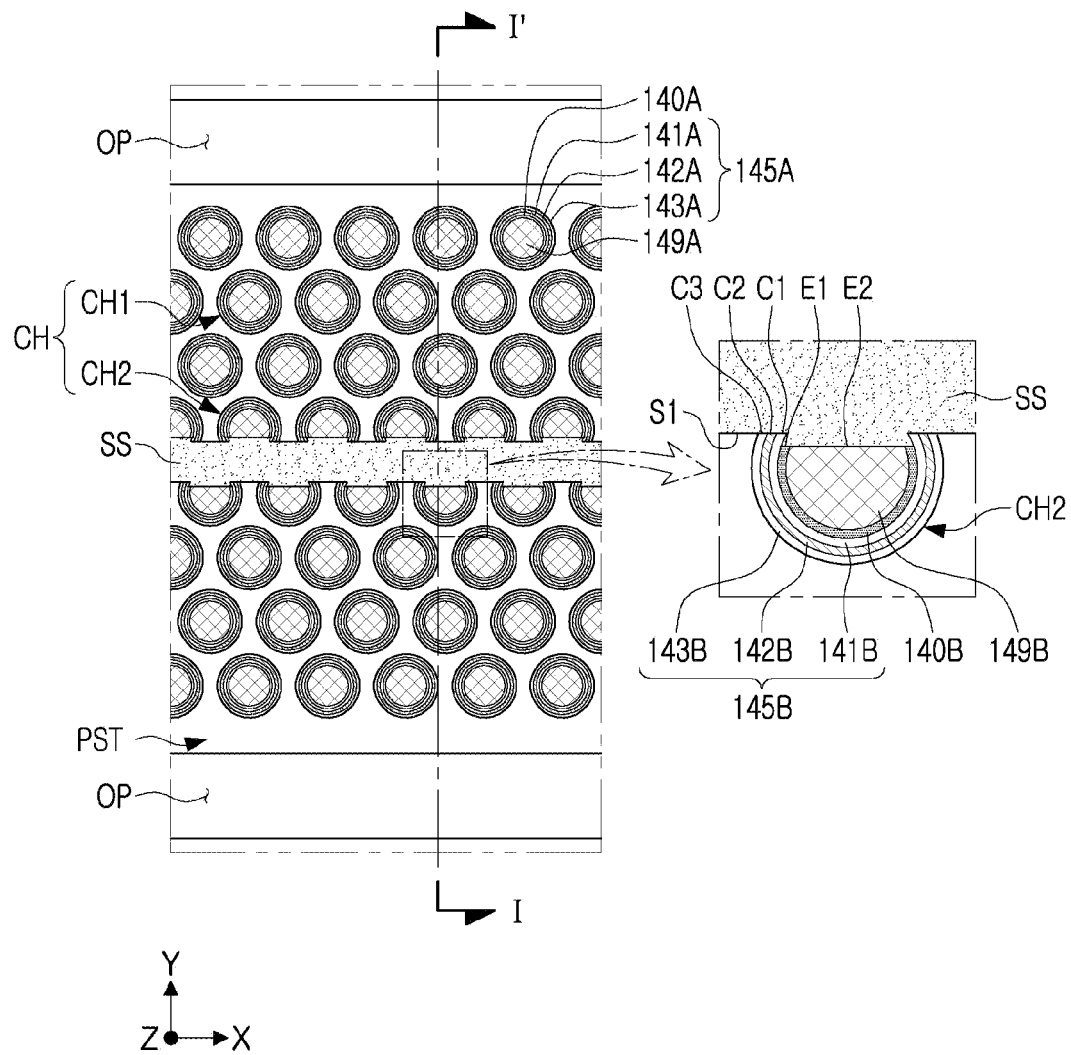
Figure 21B:
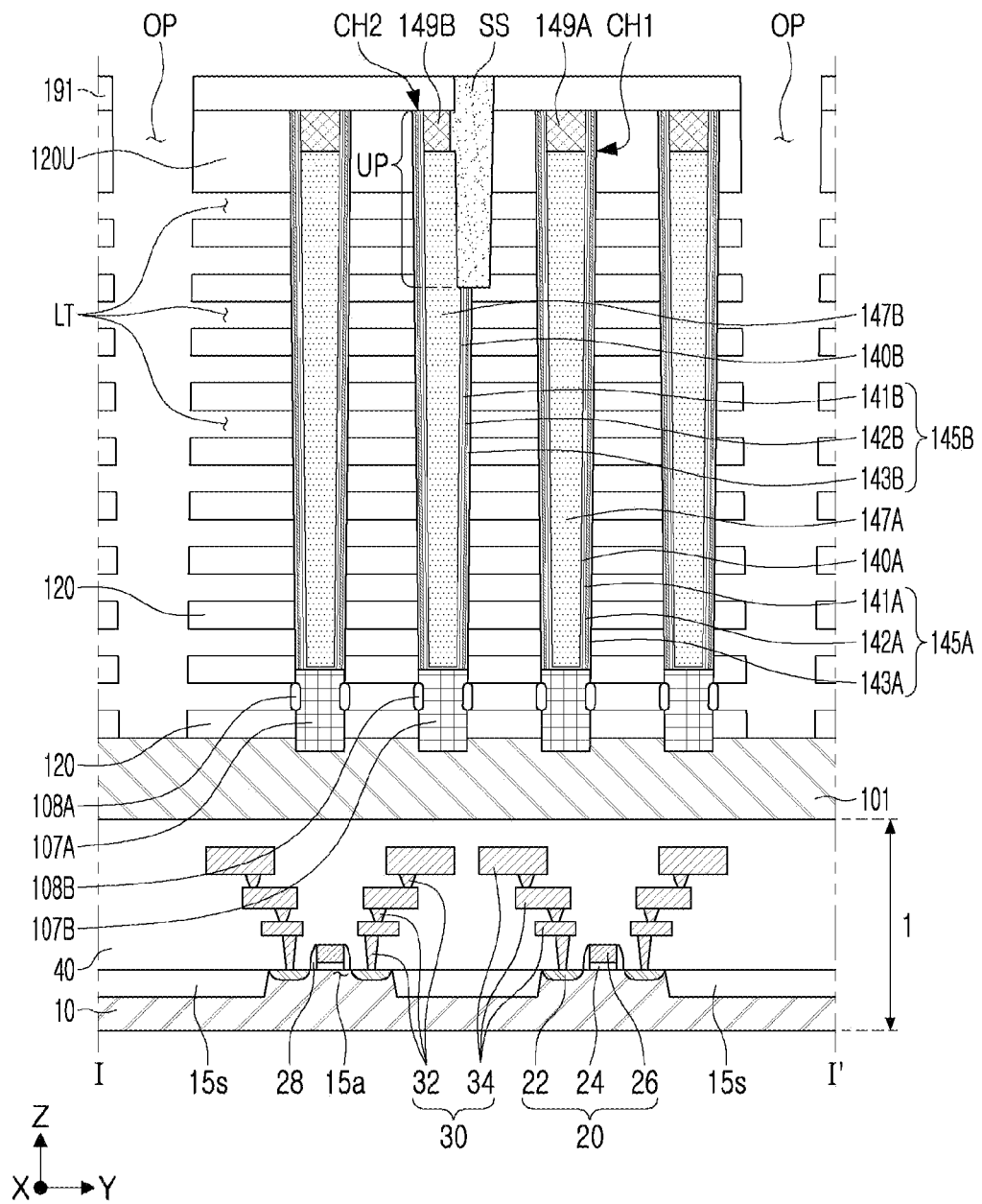
Figure 21C:
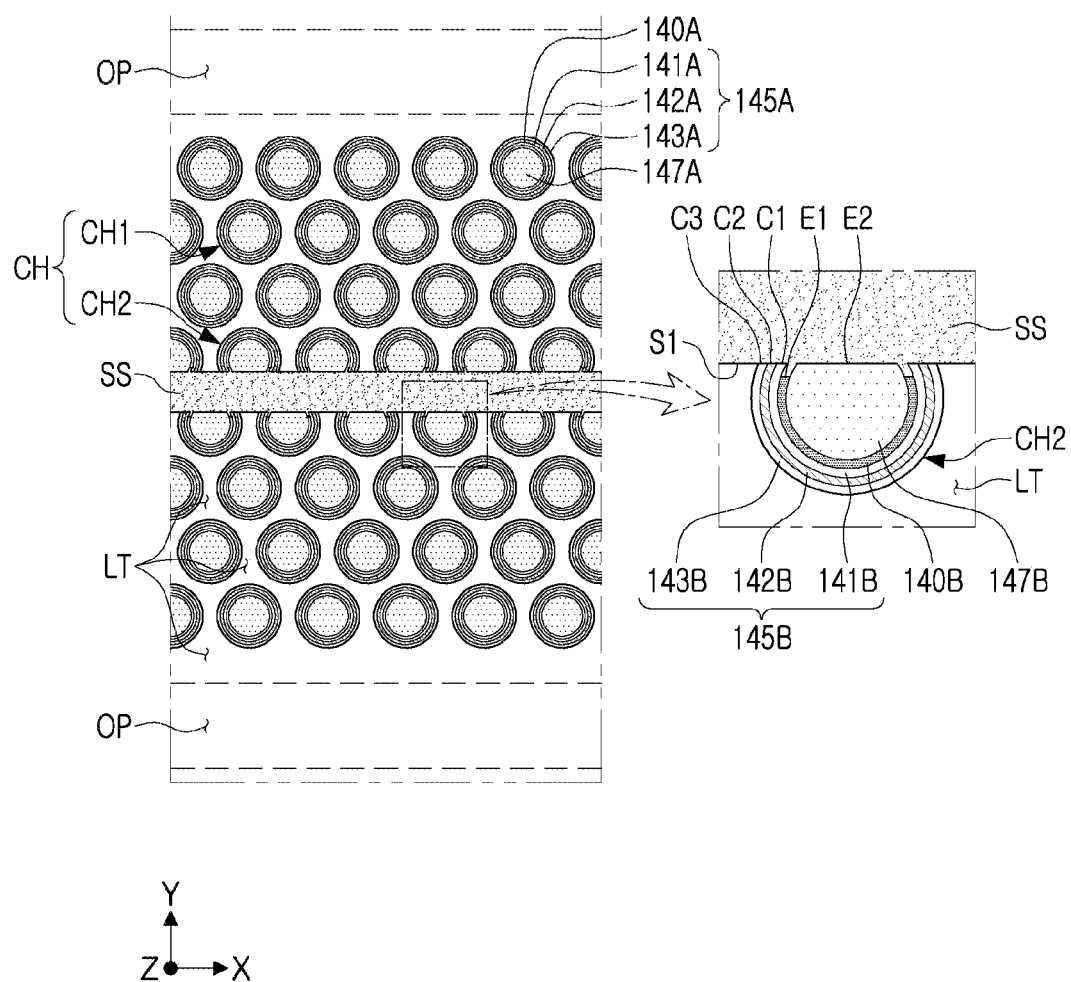

Referring to FIGS. 21A, 21B, and 21C, separation openings OP passing through the sacrificial insulating layers 110 and the interlayer insulating layers 120 and extending in the X direction may be formed, and the sacrificial insulating layers 110 may be removed through the separation openings OP to form horizontal openings LT.

First, the separation openings OP may be prepared by forming a mask layer using a photolithography process, and by anisotropically etching the first upper insulating layer 191, the sacrificial insulating layers 110, and the interlayer insulating layers 120. The separation openings OP may be formed to have a trench shape extending in the X direction, and may expose the upper substrate 101 from a lower portion thereof.

Next, the sacrificial insulating layers 110 may be selectively removed with respect to the interlayer insulating layers 120 and the first upper insulating layer 191 through the separation openings OP. Therefore, a plurality of horizontal openings LT may be formed between the interlayer insulating layers 120. Channel-lower insulating layers 108A and 108B may be formed on side surfaces of the epitaxial layers 107A and 107B exposed through the horizontal openings LT.

Figure 22:
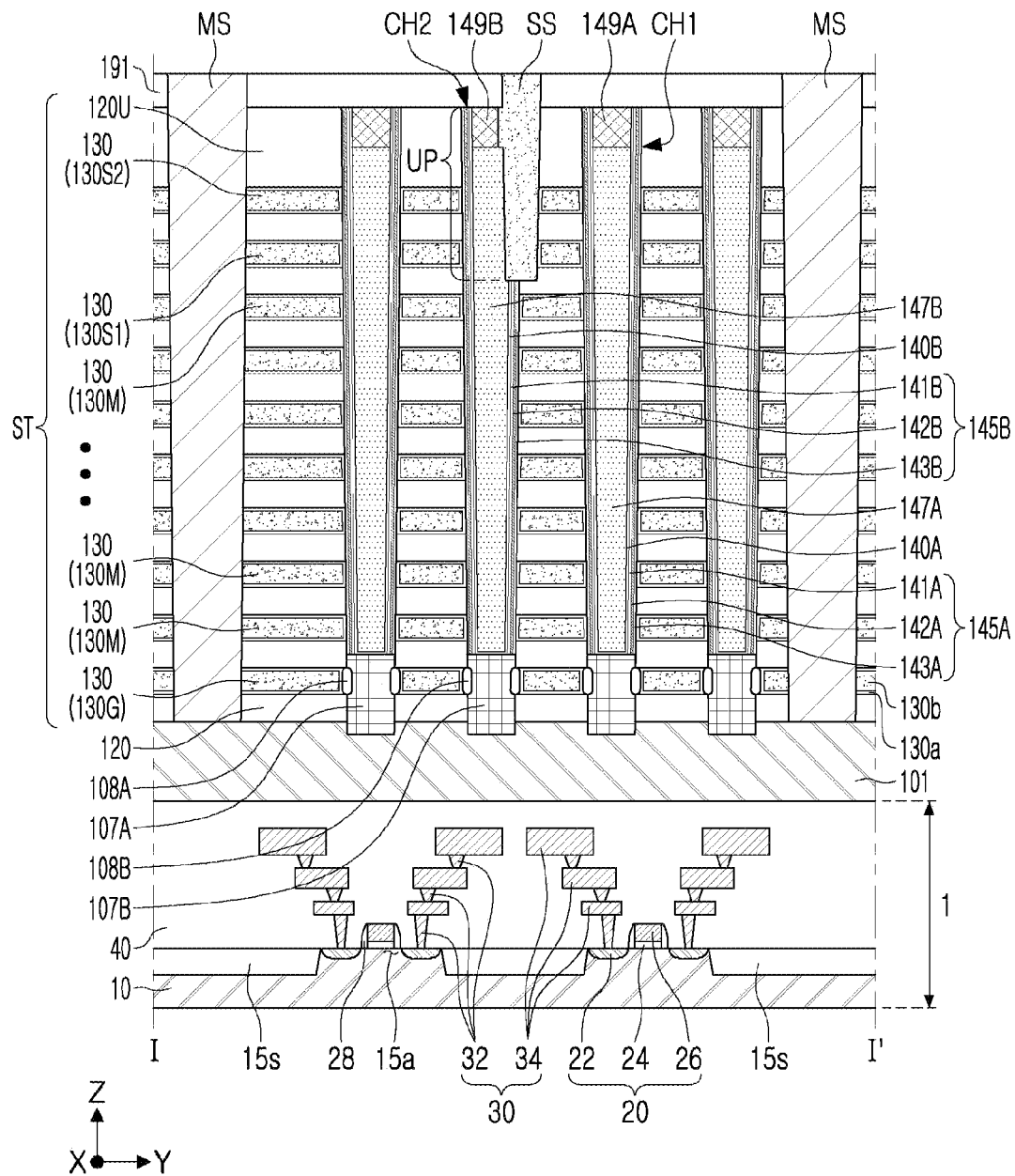

Referring to FIG. 22, gate electrodes 130 may be formed in the horizontal openings LT, and first separation patterns MS may be formed in the separation openings OP.

First, the gate electrodes 130 may be formed by filling the horizontal openings LT with a conductive material. The horizontal openings T may be formed by removing the sacrificial insulating layers 110 through the separation openings OP. Therefore, a stack structure ST in which the interlayer insulating layers 120 and the gate electrodes 130 are alternately stacked may be formed. The formation of the gate electrodes 130 may include sequentially forming a first layer 130a and a second layer 130b.

Next, the first separation patterns MS may be formed by filling the separation openings OP with an insulating material. In some embodiments, a separation insulating pattern including an insulating material and a core pattern including a conductive material may be also sequentially formed in the separation openings OP.

Next, the semiconductor device 100 of FIGS. 1 to 3 may be prepared by forming contact plugs 170, a second upper insulating layer 192, and bit lines 180.

Figure 23:
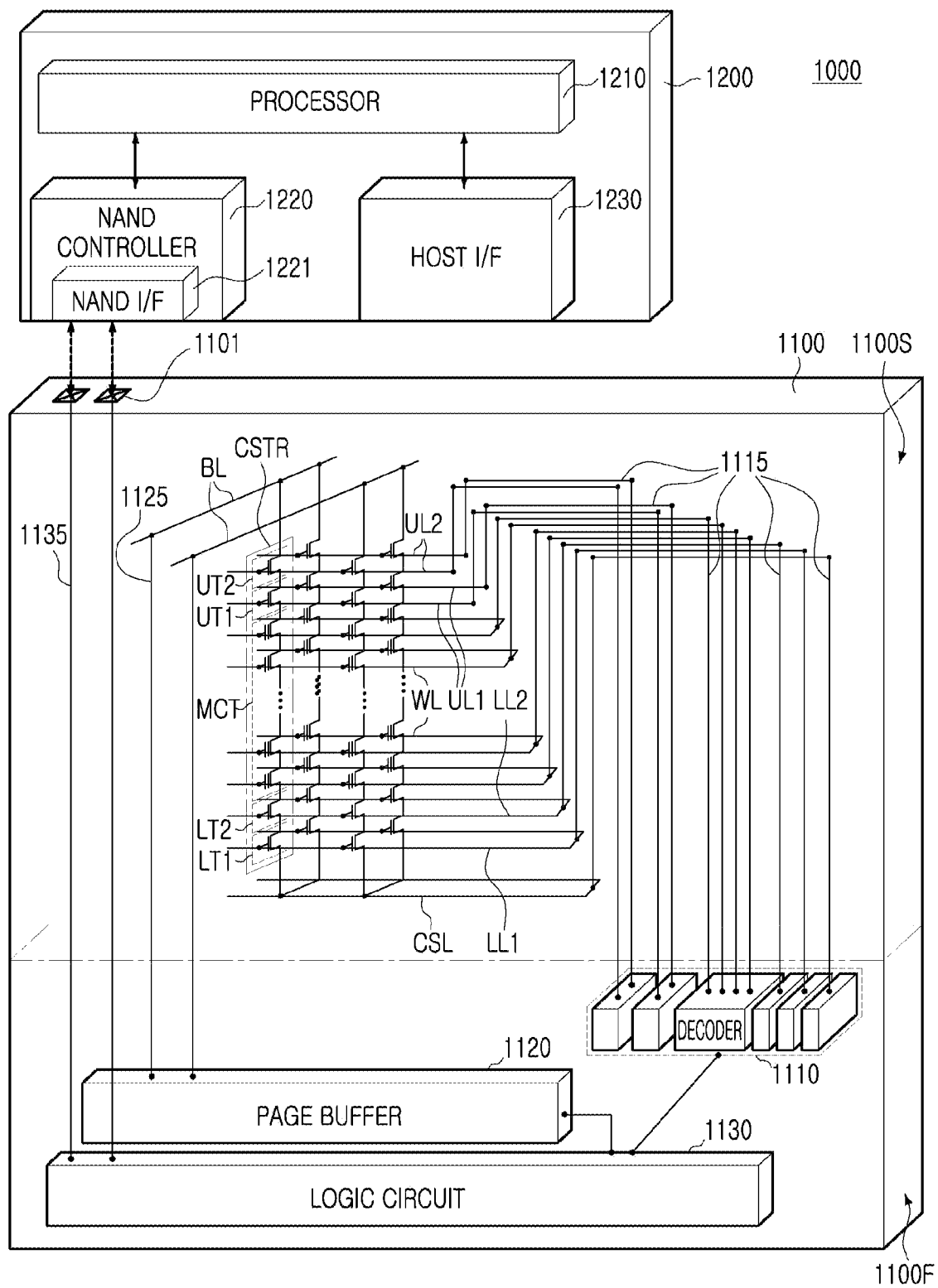
FIG. 23 is a view schematically illustrating a data storage system including a semiconductor device according to example embodiments.

FIG. 23 is a view schematically illustrating a data storage system including semiconductor devices according to example embodiments.

Referring to FIG. 23, a data storage system 1000 may include a semiconductor device 1100 and a controller 1200 electrically connected to the semiconductor device 1100. The data storage system 1000 may be a storage device including one or more semiconductor devices 1100, or an electronic device including the storage device. For example, the data storage system 1000 may be a solid state drive device (SSD), a universal serial bus (USB), a computing system, a medical device, or a communication device, including one or more semiconductor devices 1100.

The semiconductor device 1100 may be a non-volatile memory device, for example, a NAND flash memory device described above with reference to FIGS. 1 to 15. The semiconductor device 1100 may include a first structure 1100F, and a second structure 1100S on the first structure 1100F. In example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including bit lines BL, a common source line CSL, word lines WL, first and second gate upper lines UL1 and UL2, first and second gate lower lines LL1 and LL2, and memory cell strings CSTR between each of the bit lines BL and the common source line CSL.

In the second structure 1100S, each of the memory cell strings CSTR may include lower transistors LT1 and LT2 adjacent to the common source line CSL, upper transistors UT1 and UT2 adjacent to each of the bit lines BL, and a plurality of memory cell transistors MCT disposed between each of the lower transistors LT1 and LT2 and each of the upper transistors UT1 and UT2. The number of lower transistors LT1 and LT2 and the number of upper transistors UT1 and UT2 may be variously changed according to example embodiments.

In example embodiments, each of the upper transistors UT1 and UT2 may include a string select transistor, and each of the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In example embodiments, the lower transistors LT1 and LT2 may include a lower erase control transistor LT1 and a ground select transistor LT2, connected with each other in series. The upper transistors UT1 and UT2 may include a string select transistor UT1 and an upper erase control transistor UT2, connected with each other in series. At least one of the lower erase control transistor LT1 and the upper erase control transistor UT2 may be used for an erase operation of erasing data stored in the memory cell transistors MCT using a gate-induced-drain-leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection wirings 1115 extending from the first structure 1100F into the second structure 1100S. The bit lines BL may be electrically connected to the page buffer 1120 through second connection wirings 1125 extending from the first structure 1100F into the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through input/output connection wirings 1135 extending from the first structure 1100F into the second structure 1100S.

The controller 1200 may include a processor 1210, a NAND controller 1220, and a host interface 1230. According to embodiments, the data storage system 1000 may include a plurality of semiconductor devices 1100, and in this case, the controller 1200 may control the plurality of semiconductor devices 1100.

The processor 1210 may control an overall operation of the data storage system 1000 including the controller 1200. The processor 1210 may operate according to a predetermined firmware, and may access to the semiconductor device 1100 by controlling the NAND controller 1220. The NAND controller 1220 may include a NAND interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, or the like may be transmitted through the NAND interface 1221. The host interface 1230 may provide a communication function between the data storage system 1000 and an external host. When a control command is received from the external host through the host interface 1230, the processor 1210 may control the semiconductor device 1100 in response to the control command.

Figure 24:
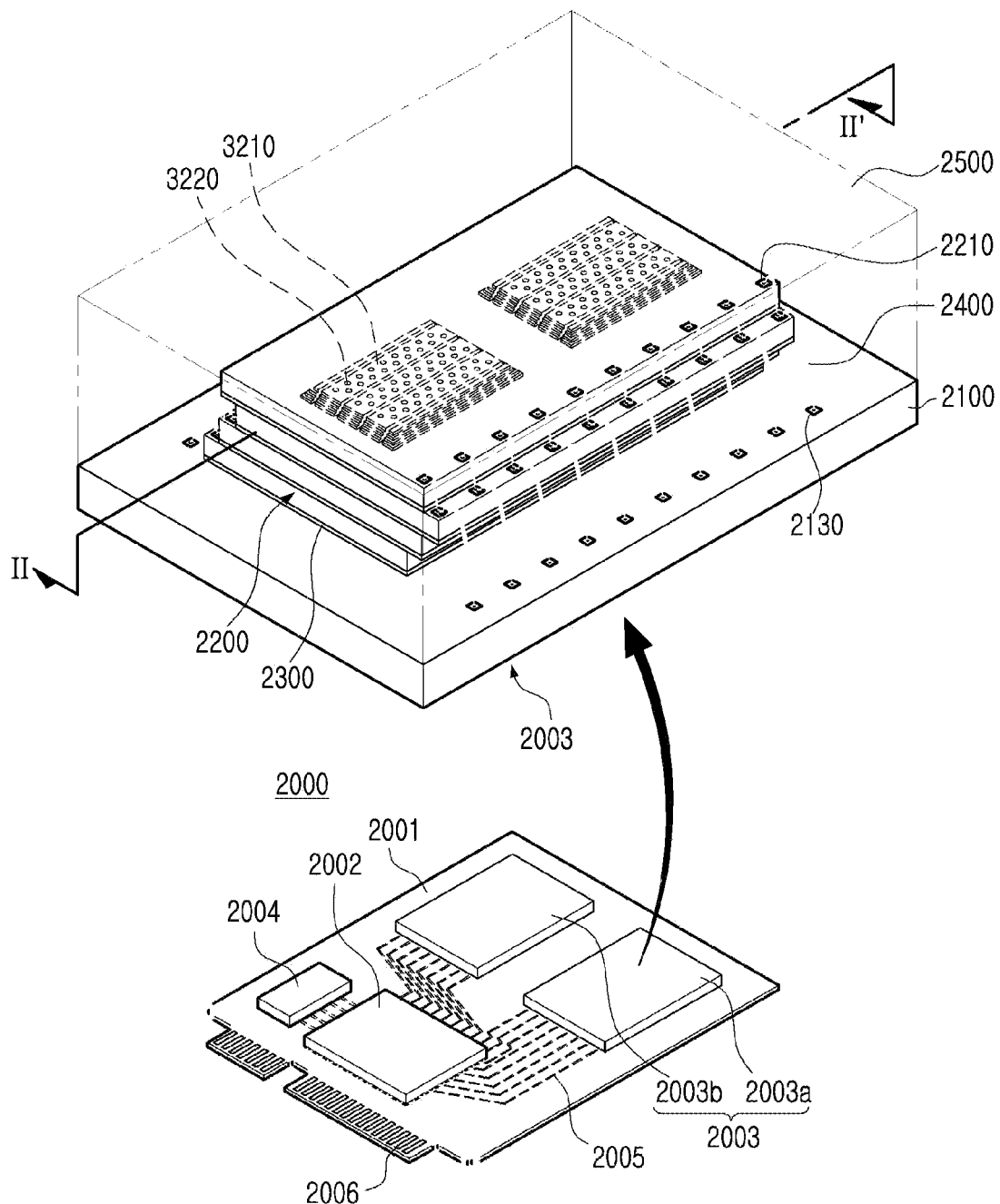
FIG. 24 is a perspective view schematically illustrating a data storage system including a semiconductor device according to an example embodiment.

FIG. 24 is a perspective view schematically illustrating a data storage system including a semiconductor device according to an example embodiment.

Referring to FIG. 24, a data storage system 2000 according to an example embodiment of the present inventive concept may include a main substrate 2001, a controller 2002 mounted on the main substrate 2001, a semiconductor package 2003, which may be provided as one or more semiconductor packages, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins, which may be coupled to an external host. The number and an arrangement of the plurality of pins in the connector 2006 may vary according to a communication interface between the data storage system 2000 and the external host. In example embodiments, the data storage system 2000 may be communicated with the external host according to any one interface of a universal serial bus (USB), peripheral component interconnection express (PCI-Express), serial advanced technology attachment (SATA), M-Phy for universal flash storage (UFS), or the like. In example embodiments, the data storage system 2000 may operate using power supplied from the external host through the connector 2006. The data storage system 2000 may further include a power management integrated circuit (PMIC) distributing power, supplied from the external host, to the controller 2002 and the semiconductor package 2003.

The controller 2002 may write data to the semiconductor package 2003 or read data from the semiconductor package 2003, and may improve an operation speed of the data storage system 2000.

The DRAM 2004 may be a buffer memory reducing a difference in speed between the semiconductor package 2003, which may be a data storage space, and the external host. The DRAM 2004 included in the data storage system 2000 may also operate as a type of cache memory, and may provide a space temporarily storing data in a control operation on the semiconductor package 2003. When the DRAM 2004 is included in the data storage system 2000, the controller 2002 may further include a DRAM controller controlling the DRAM 2004 in addition to a NAND controller controlling the semiconductor package 2003.

The semiconductor package 2003 may include first and second semiconductor packages 2003a and 2003b, spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting each of the semiconductor chips 2200 and the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 23. Each of the semiconductor chips 2200 may include stack structures 3210 and memory channel structures 3220. Each of the semiconductor chips 2200 may include a semiconductor device according to any one of the embodiments described above with reference to FIGS. 1 to 15.

In example embodiments, the connection structure 2400 may be a bonding wire electrically connecting the input/output pad 2210 and the package upper pads 2130. Therefore, in each of the first and second semiconductor packages 2003a and 2003b, the semiconductor chips 2200 may be electrically connected to each other by a bonding wire process, and may be electrically connected to the package upper pads 2130 of the package substrate 2100. According to embodiments, in each of the first and second semiconductor packages 2003a and 2003b, the semiconductor chips 2200 may be electrically connected to each other by a connection structure including a through silicon via (TSV), instead of a connection structure 2400 by a bonding wire process.

In example embodiments, the controller 2002 and the semiconductor chips 2200 may be included in one (1) package. In an example embodiment, the controller 2002 and the semiconductor chips 2200 may be mounted on a separate interposer substrate, different from the main substrate 2001, and the controller 2002 and the semiconductor chips 2200 may be connected to each other by a wiring formed on the interposer substrate.

Figure 25:
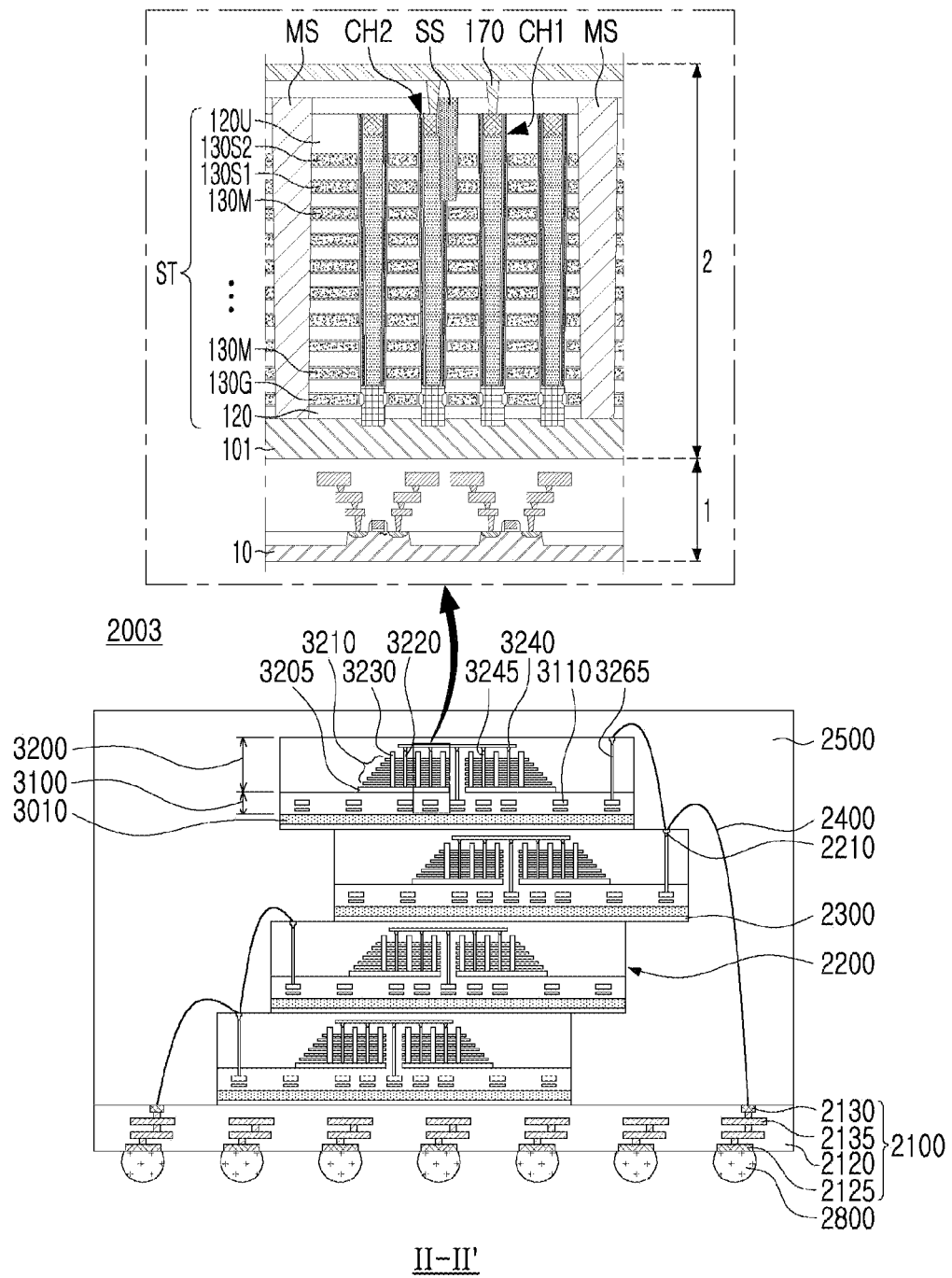
FIG. 25 is a cross-sectional view schematically illustrating a semiconductor package according to an example embodiment.

FIG. 25 is a cross-sectional view schematically illustrating a semiconductor package according to an example embodiment. FIG. 25 may illustrate an example embodiment of the semiconductor package 2003 of FIG. 24, and may conceptually illustrate a region taken along line II-II' of the semiconductor package 2003 of FIG. 24.

Referring to FIG. 25, in the semiconductor package 2003, the package substrate 2100 may be a printed circuit board. The package substrate 2100 may include a package substrate body portion 2120, package upper pads 2130 disposed on an upper surface of the package substrate body portion 2120 (see FIG. 24), lower pads 2125 disposed on a lower surface of the package substrate body portion 2120 or exposed from the lower surface, and internal wirings 2135 disposed in the package substrate body portion 2120 and electrically connecting the upper pads 2130 and the lower pads 2125 with each other. The upper pads 2130 may be electrically connected to the connection structures 2400. The lower pads 2125 may be connected to the wiring patterns 2005 of the main substrate 2001 of the data storage system 2000, as illustrated in FIG. 24, through conductive connection portions 2800.

Each of the semiconductor chips 2200 may include a semiconductor substrate 3010, and a first structure 3100 and a second structure 3200, sequentially stacked on the semiconductor substrate 3010. The first structure 3100 may include a peripheral circuit region including peripheral wirings 3110. The second structure 3200 may include a common source line 3205, a stack structure 3210 on the common source line 3205, channel structures 3220 and separation regions 3230, passing through the stack structure 3210, bit lines 3240 electrically connected to the memory channel structures 3220, and gate contact plugs 3235 electrically connected to word lines WL (refer to FIG. 23) of the stack structure 3210. As described above with reference to FIGS. 1 to 15, each of the semiconductor chips 2200 may include a lower substrate 10, circuit elements 20, an upper substrate 101, gate electrodes 130, channel structures CH, first separation patterns MS, second separation patterns SS, and bit lines 180.

Each of the semiconductor chips 2200 may include a through-wiring 3245 electrically connected to the peripheral wirings 3110 of the first structure 3100 and extending into the second structure 3200. The through-wiring 3245 may be disposed outside the stack structure 3210, and may be further disposed to pass through the stack structure 3210. Each of the semiconductor chips 2200 may further include an input/output pad 2210 electrically connected to the peripheral wirings 3110 of the first structure 3100 (refer to FIG. 24).

By recessing a portion of a channel layer contacting a separation pattern, a semiconductor device having improved electrical characteristics and reliability and a data storage system including the same may be provided.

Various advantages and effects of the present inventive concept are not limited to the above, and will be more easily understood in the process of describing specific embodiments of the present inventive concept.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
a stack structure including a plurality of interlayer insulating layers and a plurality of gate electrodes, alternately spaced apart from each other and stacked in a vertical direction, perpendicular to an upper surface of a substrate;
a plurality of first separation patterns passing through the stack structure in the vertical direction and extending in a first direction, parallel to the upper surface of the substrate;
a plurality of channel structures passing through the stack structure in the vertical direction between a pair of first separation patterns of the plurality of first separation patterns; and
a second separation pattern extending between the pair of first separation patterns in the first direction, and passing through at least one upper gate electrode including an uppermost gate electrode, among the plurality of gate electrodes, in the vertical direction,
wherein the plurality of channel structures include a first channel structure spaced apart from the second separation pattern and a second channel structure having an upper region contacting the second separation pattern, wherein the first channel structure includes a first core insulating layer, a first channel layer covering an outer side surface of the first core insulating layer, and a first gate dielectric layer covering an outer side surface of the first channel layer, wherein the second channel structure includes a second core insulating layer, a second channel layer covering an outer side surface of the second core insulating layer, and a second gate dielectric layer covering an outer side surface of the second channel layer, wherein the first gate dielectric layer includes a first tunneling layer, a first data storage layer, and a first blocking layer, sequentially arranged from the outer side surface of the first channel layer to the plurality of gate electrodes, wherein the second gate dielectric layer includes a second tunneling layer, a second data storage layer, and a second blocking layer, sequentially arranged from the outer side surface of the second channel layer to the plurality of gate electrodes, wherein, in a plan view, parallel to the upper surface of the substrate, each of the second tunneling layer, the second data storage layer, the second blocking layer, and the second channel layer, in the upper region of the second channel structure, has end portions spaced apart from each other, and wherein in the plan view, the end portions of the second channel layer are recessed away from end portions of at least one of the second tunneling layer, the second data storage layer, and the second blocking layer in a second direction parallel to the upper surface of the substrate and different from the first direction; and a plurality of bit lines disposed on the stack structure, wherein the plurality of bit lines include:

a first bit line electrically connected to the first channel layer of the first channel structure, and extending in the second direction; and a second bit line electrically connected to the second channel layer of the second channel structure, and extending in the second direction.

2. The semiconductor device of claim 1, wherein, in the plan view, the end portions of the second channel layer in the upper region of the second channel structure are recessed, in the second direction, away from a boundary between an outer side surface of the second separation pattern and the uppermost gate electrode of the plurality of gate electrodes.

3. The semiconductor device of claim 1, wherein, in the plan view, the end portions of the second channel layer in the upper region of the second channel structure are recessed, in the second direction, away from a boundary between an outer side surface of the second separation pattern and the second core insulating layer.

4. The semiconductor device of claim 1, wherein, in the plan view, the second separation pattern comprises a pattern portion extending in the first direction and a protrusion extending in the second direction from the pattern portion between the second core insulating layer and each of the end portions of the second tunneling layer to contact the end portions of the second channel layer, and wherein the protrusion contacts the pattern portion.

5. The semiconductor device of claim 1, wherein, in the plan view, the second separation pattern is disposed to partially overlap the second channel structure in the vertical direction.

6. The semiconductor device of claim 1, wherein the first channel structure further comprises a first channel pad disposed on the first core insulating layer and contacting the first channel layer, wherein the second channel structure further comprises a second channel pad disposed on the second core insulating layer and contacting the second channel layer, wherein the second channel pad has an end portion cut along a chord in the vertical direction, the chord connecting two points on a circumference of the second channel pad with each other, and wherein, in the plan view, the end portion of the second channel pad is recessed in the second direction away from at least one end portion among end portions of the second gate dielectric layer.

7. The semiconductor device of claim 1, wherein the first channel structure further comprises a first channel pad disposed on the first core insulating layer and contacting the first channel layer, wherein the second channel structure further comprises a second channel pad disposed on the second core insulating layer and contacting the second channel layer, wherein the semiconductor device further comprises:
a first contact plug disposed on the first channel structure and connected to the first channel pad; and
a second contact plug disposed on the second channel structure and connected to the second channel pad, and wherein the first bit line and the second bit line are disposed on the first contact plug and the second contact plug, respectively.

8. The semiconductor device of claim 1, wherein, in the plan view, the first channel layer has a ring shape forming a single closed curve, and wherein, in the plan view, the second channel layer in the upper region of the second channel structure has a ring shape cut by the second separation pattern.

9. The semiconductor device of claim 1, wherein the plurality of first separation patterns are in contact with the substrate, wherein the second separation pattern is spaced apart from the substrate, and wherein an upper surface of the second separation pattern is located at a higher level than an upper surface of the second channel structure, based on the upper surface of the substrate.

10. The semiconductor device of claim 1, wherein a length of a region in which the second channel layer is recessed from an extension line of an interface at which the second gate dielectric layer and the second separation pattern are in contact with each other, in the second direction away from an outer side surface of the second separation pattern, is about 1 nm to about 30 nm.

11. The semiconductor device of claim 1, wherein a length of a region in which the second channel layer is recessed from an extension line of an interface at which the second gate dielectric layer and the second separation pattern are in contact with each other, in the second direction away from an outer side surface of the second separation pattern, is about 8 nm to about 12 nm.

12. A semiconductor device comprising:
a stack structure including a plurality of interlayer insulating layers and a plurality of gate electrodes, alternately spaced apart from each other and stacked in a direction, perpendicular to an upper surface of a substrate;
a plurality of first separation patterns passing through the stack structure in a vertical direction and extending in a first direction, parallel to the upper surface of the substrate;
a second separation pattern passing through at least a portion of the stack structure between a pair of first separation patterns of the plurality of first separation patterns in the vertical direction and extending in the first direction;
a cutting channel structure passing through the stack structure in the vertical direction, having an end portion partially cut by the second separation pattern, and including a channel layer; and
a plurality of bit lines disposed on the stack structure and the cutting channel structure,
wherein the plurality of bit lines include a first bit line electrically connected to the channel layer of the cutting channel structure, and extending in a second direction which is parallel to the upper surface of the substrate and is perpendicular to the first direction,
wherein the cutting channel structure includes a tunneling layer, a data storage layer, and a blocking layer, sequentially arranged from an outer side surface of the channel layer to the plurality of gate electrodes,
wherein, in a plan view, parallel to the upper surface of the substrate, the channel layer, in an upper region of the cutting channel structure, has a ring shape cut by the second separation pattern so that the channel layer has end portions spaced apart from each other,
wherein the end portions of the channel layer contact the second separation pattern, and
wherein in the plan view, the end portions of the channel layer are spaced apart from an extension line of a first interface at which the data storage layer and the second separation pattern are in contact with each other in the second direction away from an outer side surface of the second separation pattern.

13. The semiconductor device of claim 12,
wherein, in the plan view, the data storage layer, in the upper region of the cutting channel structure, has a ring shape cut by the second separation pattern so that the data storage layer has end portions spaced apart from each other.

14. The semiconductor device of claim 12,
wherein, in the plan view, the end portions of the channel layer, in the upper region of the cutting channel structure, are recessed away from a portion in which the plurality of gate electrodes are in contact with a side surface of the second separation pattern.

15. The semiconductor device of claim 12,
wherein the cutting channel structure further comprises a channel pad disposed on the upper region of the cutting channel structure and contacting the channel layer,
wherein the channel pad has an end portion cut along a chord in the vertical direction, the chord connecting two points on a circumference of the channel pad with each other, and
wherein, in the plan view, the end portion of the channel pad is recessed from the extension line of the first interface in the second direction away from the outer side surface of the second separation pattern.

16. The semiconductor device of claim 15,
wherein the end portions of the channel layer are spaced apart by a first length from the extension line of the first interface in the second direction away from the outer side surface of the second separation pattern, and
wherein the end portion of the channel pad is spaced apart by a second length from the extension line of the first interface in the second direction away from the outer side surface of the second separation pattern, the second length being different from the first length.

17. The semiconductor device of claim 12,
wherein, in the plan view, the second separation pattern comprises a protrusion extending along an inner surface of the tunneling layer to contact the end portions of the channel layer.

18. The semiconductor device of claim 12,
wherein, in the cutting channel structure, the channel layer comprises a first separation channel layer and a second separation channel layer, completely separated from each other by the second separation pattern,
wherein, in the cutting channel structure, the data storage layer comprises a first separation data storage layer and a second separation data storage layer, completely separated from each other by the second separation pattern,
wherein, in the plan view, the first separation channel layer has an end portion recessed from an end portion of the first separation data storage layer contacting a first surface of the second separation pattern in a direction away from the first surface of the second separation pattern, and
wherein, in the plan view, the second separation channel layer has an end portion recessed from an end portion of the second separation data storage layer contacting a second surface, opposite to the first surface, of the second separation pattern in a direction away from the second surface of the second separation pattern.

19. A data storage system comprising:
a semiconductor storage device including:
  a first structure including a lower substrate, circuit elements on the lower substrate, and a lower wiring structure electrically connected to the circuit elements;
  a second structure on the first structure; and
  an input/output pad electrically connected to the circuit elements; and
a controller electrically connected to the semiconductor storage device through the input/output pad and configured to control the semiconductor storage device,
wherein the second structure comprises:
  an upper substrate;
  a stack structure including a plurality of interlayer insulating layers and a plurality of gate electrodes, alternately spaced apart from each other and stacked in a vertical direction, perpendicular to an upper surface of the upper substrate;
  a plurality of first separation patterns passing through the stack structure in the vertical direction and extending in a first direction, parallel to the upper surface of the upper substrate;
  a second separation pattern passing through at least a portion of the stack structure between a pair of first separation patterns of the plurality of first separation patterns in the vertical direction and extending in the first direction;
  a cutting channel structure passing through the stack structure in the vertical direction, having an end portion partially cut by the second separation pattern, and including a channel layer; and a plurality of bit lines disposed on the stack structure and the cutting channel structure, wherein the plurality of bit lines include a first bit line electrically connected to the channel layer of the cutting channel structure, and extending in a second direction which is parallel to the upper surface of the upper substrate and is perpendicular to the first direction, wherein the cutting channel structure includes a tunneling layer, a data storage layer, and a blocking layer, sequentially arranged from an outer side surface of the channel layer to the plurality of gate electrodes, wherein, in a plan view, parallel to the upper surface of the upper substrate, the channel layer, in an upper region of the cutting channel structure, has a ring shape cut by the second separation pattern so that the channel layer has end portions spaced apart from each other, wherein the end portions of the channel layer in the upper region of the cutting channel structure contact the second separation pattern, and wherein, in the plan view, the end portions of the channel layer are spaced apart from an extension line of an interface at which the data storage layer and the second separation pattern are in contact with each other in the second direction away from an outer side surface of the second separation pattern.

20. The data storage system of claim 19, wherein, in the plan view, the data storage layer, in the upper region of the cutting channel structure, has a ring shape cut by the second separation pattern so that the data storage layer has end portions spaced apart from each other, and wherein, in the plan view, the end portions of the channel layer are recessed from a portion in which the plurality of gate electrodes are in contact with a side surface of the second separation pattern in the second direction away from the outer side surface of the second separation pattern.

* * * * *